US012812942B2

(12) United States Patent
Kurosawa

(10) Patent No.: US 12,812,942 B2
(45) Date of Patent: Nov. 24, 2026

(54) PLANARIZATION APPARATUS AND ARTICLE MANUFACTURING METHOD

(71) Applicant: CANON KABUSHIKI KAISHA, Tokyo (JP)

(72) Inventor: Hiroshi Kurosawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1036 days.

(21) Appl. No.: 17/974,871

(22) Filed: Oct. 27, 2022

(65) Prior Publication Data

US 2023/0146279 A1 May 11, 2023

(30) Foreign Application Priority Data

Nov. 8, 2021 (JP) ................................ 2021-182059

(51) Int. Cl.

| | |
|---|---|
| ***H10P 72/00*** | (2026.01) |
| ***H10D 64/01*** | (2025.01) |
| ***H10P 72/30*** | (2026.01) |
| ***H10P 72/70*** | (2026.01) |
| ***H10P 72/72*** | (2026.01) |
| ***H10P 72/76*** | (2026.01) |

(52) U.S. Cl.

CPC ... *H10D 64/01326* (2026.01); *H10P 72/0448* (2026.01); *H10P 72/0456* (2026.01); *H10P 72/0462* (2026.01); *H10P 72/30* (2026.01); *H10P 72/70* (2026.01); *H10P 72/722* (2026.01); *H10P 72/7602* (2026.01)

(58) Field of Classification Search

None

See application file for complete search history.

(56) References Cited

U.S. PATENT DOCUMENTS 6,019,214 A * 2/2000 Herronen ............... B23Q 7/035 198/465.1
6,430,839 B1 * 8/2002 Kuroda ............. H01L 21/67727 414/217
8,394,282 B2 3/2013 Panga et al.
2008/0277885 A1 * 11/2008 Duff .................... H01L 21/6838 198/346.2
2020/0333702 A1 10/2020 Iwatani et al.

FOREIGN PATENT DOCUMENTS

WO 2020213571 A1 10/2020

* cited by examiner

*Primary Examiner* — Binu Thomas

(74) *Attorney, Agent, or Firm* — ROSSI, KIMMS & McDOWELL LLP

(57) ABSTRACT

A planarization apparatus includes a plurality of processors each configured to perform a planarization process on a substrate. Each of the processors includes a substrate chuck, and is configured to perform a planarization process on a substrate chucked by the substrate chuck. A conveyer is configured to convey a substrate chuck of a processor selected from the plurality of processors along a conveyance path including a common conveyance path shared by the plurality of processors. A supplier is arranged on a path of movement of the substrate chuck by the conveyer along the common conveyance path, and is configured to supply a composition to be used in the planarization process onto the substrate chucked by the substrate chuck.

8 Claims, 26 Drawing Sheets

100

PLANARIZATION APPARATUS AND ARTICLE MANUFACTURING METHOD

BACKGROUND OF THE INVENTION

Field of the Invention

The present invention relates to a planarization apparatus and an article manufacturing method.

Description of the Related Art

When assuming a mass production apparatus for semiconductor devices or the like, a pattern transfer method and apparatus with jet-and-flash imprint lithography (to be referred to as "JFIL" hereinafter) applied thereto have been known. The imprint method by JFIL is generally performed as follows. First, a supply mechanism using inkjet nozzles or the like supplies, to a shot region as an imprint target on a wafer, a composition which is cured by ultraviolet light. Then, a mold with a device pattern drawn thereon is brought into contact with the composition. When the composition is sufficiently filled into the pattern of the mold, ultraviolet light (UV) is applied to cure the composition. After that, the mold is separated from the composition. Thus, a fine pattern having good line width variations can be formed on the wafer.

In an Extreme Ultraviolet (EUV) photolithography step, along with an increase of the NA, the depth of focus (to be referred to as "DOF" hereinafter) at which the projection image of a fine circuit pattern is formed is decreasing in recent years. For example, in a recent example, the allowable DOF of an EUV lithography apparatus with NA=0.33 is 300 nm to 110 nm (depending on the illumination mode). The allowable DOF of an EUV lithography apparatus with NA=0.55 is 160 nm to 40 nm (depending on the illumination mode). However, it has been found that it is difficult for the method of applying a SOC film by a conventional spin coater to achieve the sufficient surface planarization performance which falls within the allowable range as described above. Particularly, in a case of spin coating, a layer having a uniform film thickness is formed on a wafer due to the viscosity of the SOC coating agent dropped onto the wafer and the centrifugal force by spinning. Therefore, if a region where a change in wiring density of the underlying pattern of the process wafer is 5 μm or more exists in a long cycle, the border where the wiring density changes is left intact and appears on the surface of the SOC film.

U.S. Pat. No. 8,394,282 discloses a planarization method with some imprint techniques described in the above-described background arts applied thereto. In this method, a superstrate as a member with no pattern formed thereon is pressed against a composition in a liquid state supplied onto a wafer, the composition is cured by UV exposure after the composition has spread, and then the superstrate is separated. Note that the term "imprint" is often used in the concept of transferring a pattern drawn on a mold by pressing the pattern, but in the planarization process that is the subject of the present invention, no pattern has been drawn on the superstrate.

On the other hand, since the planarization apparatus as described above supplies the composition to the entire surface of the substrate and collectively performs the imprint processes, the throughput can be a problem. Therefore, it is conceivable to form the planarization apparatus as a cluster so that a plurality of substrates can be processed in parallel. International Publication No. 2020/213571 discloses a configuration including a plurality of planarization processors and one supplier (dispenser system) shared by them.

The dispenser system has an individual difference regarding variations of the discharge amount and discharge position of each nozzle which discharges a composition. Hence, it is necessary to manage and suppress such the individual difference. In addition, the dispenser system itself is expensive. On the other hand, the dispenser system can supply the composition for about less than 10 sec for one wafer. Thus, the processing capability is three to four times higher than that for the planarization process. Accordingly, in order to implement the cluster configuration of the planarization apparatus which is inexpensive and has high productivity, the configuration including a plurality of planarization processors and one dispenser system shared by them is desirable in terms of system design balance.

However, if an existing substrate stage is to be used for such a cluster configuration, there are design restrictions such as a limited driving range of the substrate stage. Therefore, it was necessary to form the dispensing function and the planarization processing function as separate wafer stage modules. In that case, a conveyance robot is required to convey a substrate between the dispensing module and the planarization processing module. Accordingly, requirements such as the conveyance accuracy, the conveyance time, and control of volatilization of the UV-curable composition during conveyance are added. Hence, there are drawbacks that system design restrictions are increased, and the size and complexity of the apparatus are also increased.

In addition, in order for the conveyance robot to receive a wafer from the wafer stage, it is necessary to separate the wafer from the wafer chuck and lift the wafer from the chuck, during wafer transfer, by wafer lift pins provided on a part of the outer periphery of the wafer chuck. On the other hand, when the conveyance robot passes the wafer to the wafer stage, it is necessary to perform the above-described procedure in a reverse order. Therefore, there is a problem that it takes time each time the conveyance robot passes/receives the wafer, so that the productivity of the apparatus is not improved.

SUMMARY OF THE INVENTION

The present invention provides a technique advantageous in achieving both maintaining the high productivity in the cluster configuration of a planarization apparatus and decreasing the complexity of the apparatus configuration.

The present invention in its one aspect provides a planarization apparatus comprising a plurality of processors each including a substrate chuck, and configured to perform a planarization process on a substrate chucked by the substrate chuck, a conveyer configured to convey a substrate chuck of a processor selected from the plurality of processors along a conveyance path including a common conveyance path shared by the plurality of processors, and a supplier arranged on a path of movement of the substrate chuck by the conveyer along the common conveyance path, and configured to supply a composition to be used in the planarization process onto the substrate chucked by the substrate chuck.

Further features of the present invention will become apparent from the following description of exemplary embodiments (with reference to the attached drawings).

DESCRIPTION OF THE EMBODIMENTS

Figure 1:
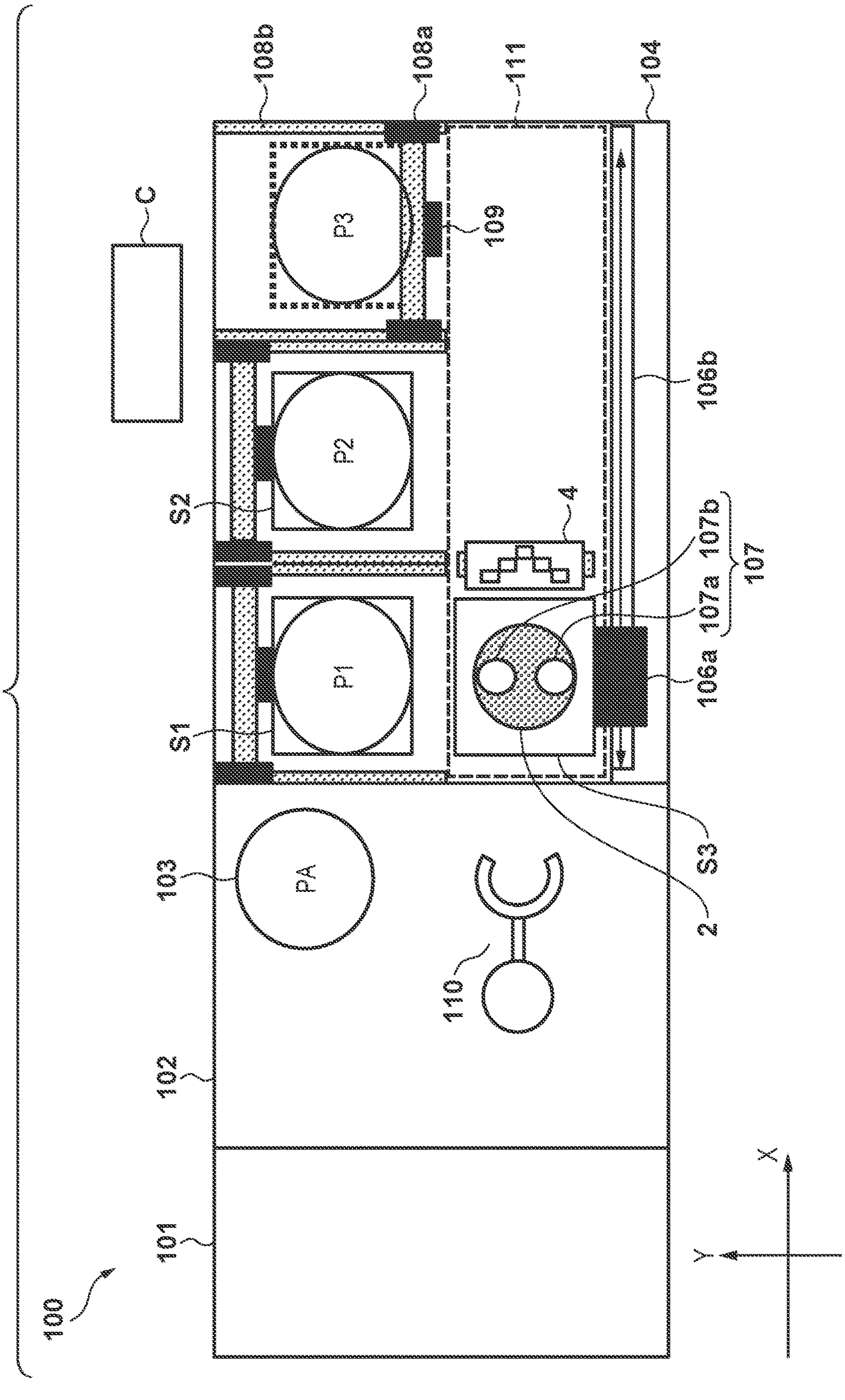
FIG. 1 is a view showing the configuration of a planarization apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the specification and the drawings, directions will be indicated on an XYZ coordinate system in which a horizontal surface is defined as the X-Y plane. In general, a substrate as a process target is placed on a substrate stage such that the surface of the substrate is parallel to the horizontal surface (X-Y plane). Therefore, in the following description, the directions orthogonal to each other in a plane along the surface of the substrate are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively, and a rotational direction around the X-axis, a rotational direction around the Y-axis, and a rotational direction around the Z-axis are referred to as the Ox direction, the Oy direction, and the Oz direction, respectively.

First Embodiment

The underlying pattern on a substrate has a concave-convex profile derived from a pattern formed in the previous step. In a case of a general logic process wafer, pattern-derived concave/convex portions of about 80 nm to 100 nm exist. The step derived from the moderate undulation of the entire surface of the substrate can be corrected by the focus tracking function of a scan exposure apparatus used in the photo process. However, the fine concave/convex portions having a pitch small enough to fall within the exposure slit area of the exposure apparatus cannot be corrected by the focus tracking function described above. If there are many concave/convex portions, the they may fall outside the DOF (Depth Of Focus) of the exposure apparatus. As a conventional method of planarizing the underlying pattern of the substrate, a method of forming a planarized layer, such as SOC (Spin On Carbon) or CMP (Chemical Mechanical Polishing), is used. However, the conventional technique undesirably cannot obtain sufficient planarization performance, and the concave/convex difference of the underlayer by multilayer formation tends to increase.

In order to solve this problem, studies have been conducted on a planarization apparatus that planarizes a substrate by applying a JFIL technique. With reference to FIGS. 7A to 7D, the outline of a planarization technique using the JFIL technique will be described. In the planarization process using the JFIL technique, a substrate can be planarized through a supply step of supplying a UV-curable composition shown in FIG. 7A, a contact step of bringing a superstrate into contact with the composition shown in FIG. 7B, a curing step shown in FIG. 7C, and a mold separation step of separating the superstrate from the cured composition shown in FIG. 7D. In FIGS. 7A to 7D, a circuit pattern has been already formed on the surface of a substrate W chucked by a substrate chuck 1, and there can be pattern-derived concave/convex portions of, for example, about 80 nm to 100 nm. The requirement of the planarization apparatus according to this embodiment is to planarize the pattern-derived surface concave/convex portions.

Figure 7A:
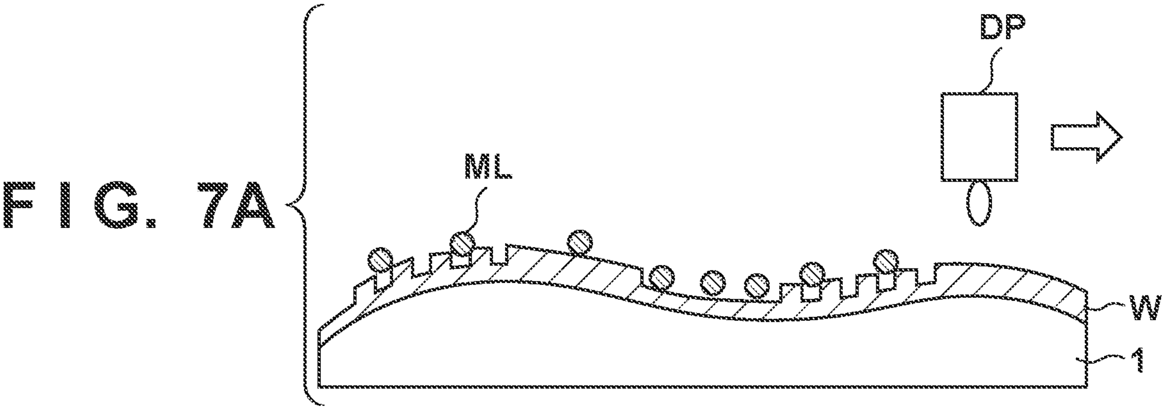
FIGS. 7A to 7D are views for explaining a planarization process.

In the supply step shown in FIG. 7A, a composition ML as a planarization material is supplied from a dispenser DP to the surface of the substrate W chucked by the substrate chuck 1. The dispenser DP is arranged on a bridge (not shown) suspended above a base that also serves as a Z-direction guide of a substrate stage holding the substrate chuck 1. By scanning and driving the substrate W chucked by the substrate chuck 1 once or a plurality of times below the dispenser DP, the composition ML is supplied to the entire surface of the substrate. The dispenser DP can be a jetting module for supplying the composition ML in a state of droplets. The dispenser DP can supply the composition ML while applying the supply amount distribution thereof in accordance with the arrangement of the concave/convex pattern formed on the surface of the substrate W and the like. More specifically, the composition ML can be supplied such that the droplet density is high for a portion where the ratio of the concave portion of the pattern on the substrate surface is high, and the droplet density is low for a portion where the ratio of the concave portion is low. To do this, when the composition ML is supplied by the dispenser DP, substrate alignment measurement can be performed to preliminarily match the position of the pattern formed on the substrate W with the position of the density pattern of the composition ML to be supplied.

Figure 7B:
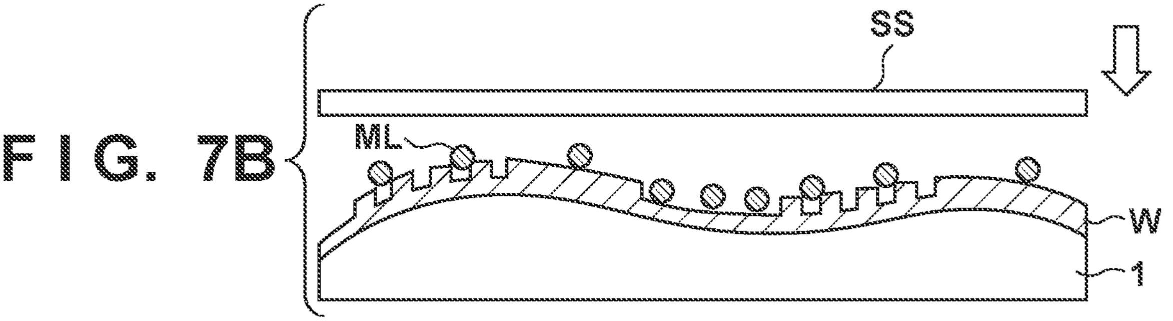

In the contact step shown in FIG. 7B, a superstrate SS (to be also referred to as a "flat template"), which is a member including a flat surface with no pattern formed thereon and has an outer diameter equal to or larger than that of the substrate W, is brought into contact with the composition ML, and the superstrate SS is pressed against the entire region of the surface of the substrate W. With this, the composition ML spreads in a layer (to be referred to as "filling" or "spreading" hereinafter).

Figure 7C:
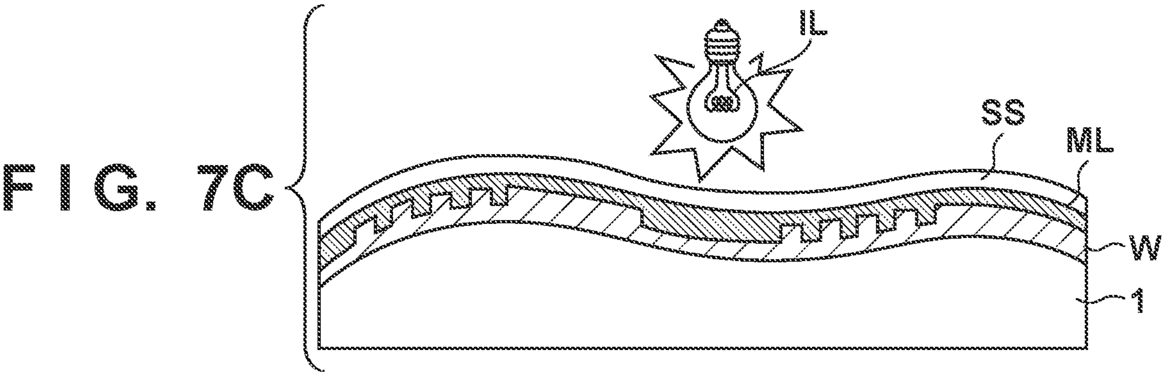

In the curing step shown in FIG. 7C, in a state in which the superstrate SS is in contact with the composition ML on the substrate W, ultraviolet light from a light source IL is applied to the entire region of the surface of the substrate W collectively (or by repeating partial exposure). With this, the composition ML spread in the layer is cured.

Figure 7D:
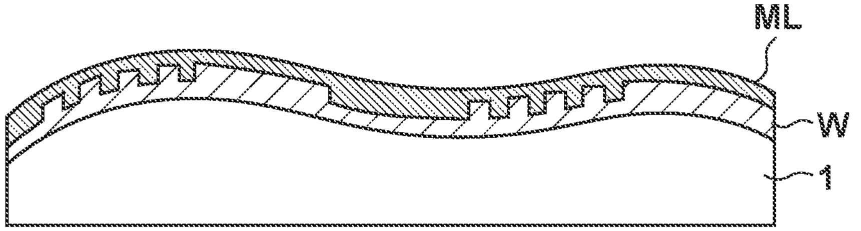

In the mold separation step shown in FIG. 7D, the superstrate SS is separated from the cured composition ML on the substrate W. Thus, the pattern-derived surface concave/convex portions of the substrate W are planarized. Note that it is not an object here to correct the flatness of a component with a low spatial frequency, such as the profile of the entire substrate distorted with respect to the absolute plane. For such a component, the non-planar component is compensated by the focus tracking control of an exposure apparatus in a subsequent pattern forming step.

In this manner, the planarization process with the imprint technique applied thereto is a technique of supplying a composition in accordance with the steps of a substrate, bringing a thin flat member called a superstrate into contact with the supplied composition, and curing the composition, thereby performing planarization on the nanometer order.

Figure 4:
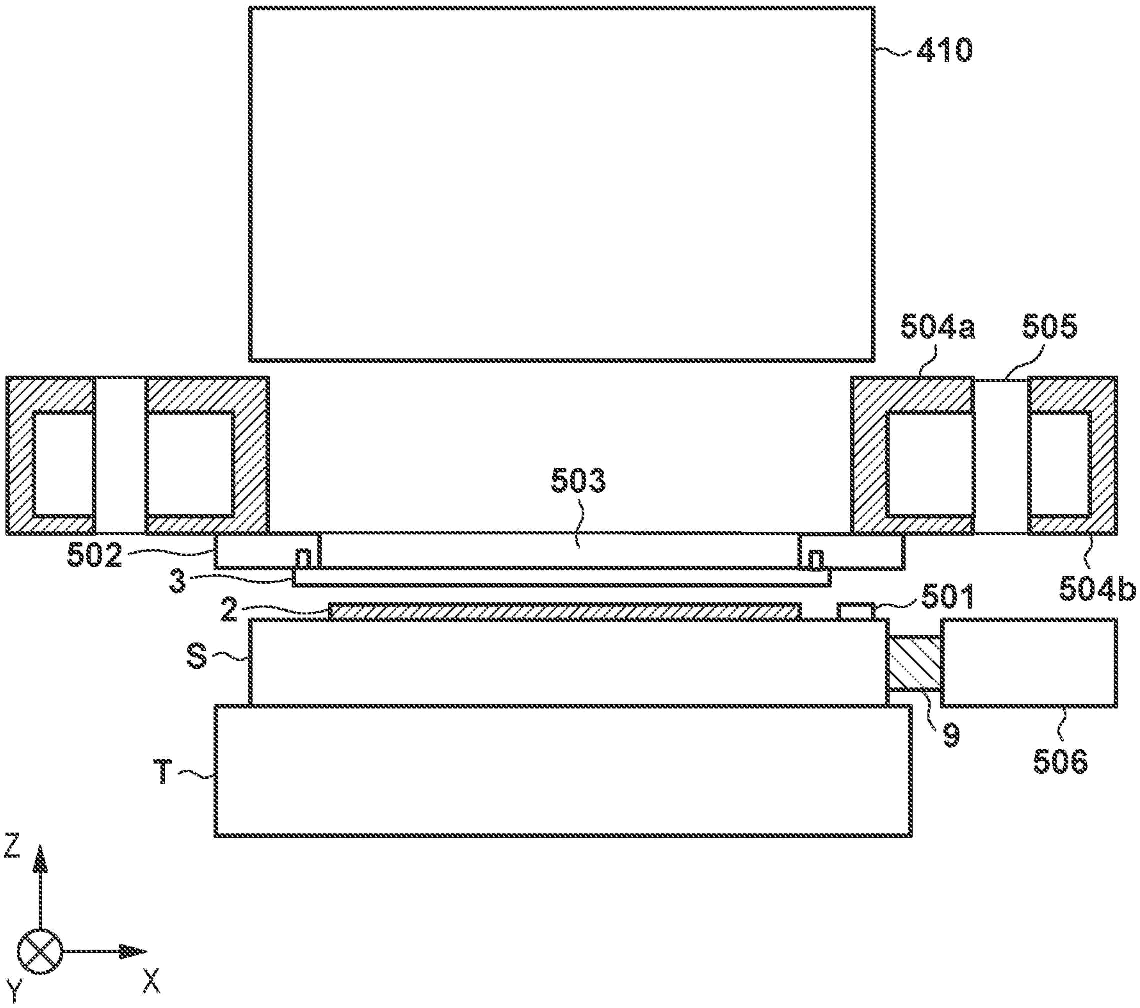
FIG. 4 is a view showing the configuration of a planarization head system.

FIG. 4 is a view showing the configuration of a planarization head system that performs a planarization process as described above. In FIG. 4, a superstrate 3 corresponds to the superstrate SS in FIG. 7B. The superstrate 3 is a member with no fine pattern drawn thereon, and can serve as a flat reference surface after the planarization process. In this embodiment, when a substrate chuck S placed on a substrate stage T is connected with a clutch 9, the position of the substrate chuck S is controlled by a linear motor 506 attached to the clutch. Specific functions and arrangements of the clutch and linear motor will be described later. On the substrate chuck S, sensors 501 that measure upward in the Z direction are arranged, for example, in two channels in the depth direction of the drawing surface. These sensors 501 can measure the Z-direction position and leveling (θx, θy) of the superstrate 3. Further, by observing the edge portion of the superstrate 3 while scanning the substrate stage T in the Y direction, these sensors 501 can measure the positional shift amount of the superstrate 3 in the X and Y directions with respect to a superstrate chuck 502.

A cavity 503 partitioned by a transparent member with respect to an exposure light source (corresponding to the light source IL in FIG. 7C) included in an illumination/spread observation system 410 is arranged above the superstrate 3. When bringing the superstrate 3 into contact with the composition on a substrate 2, the pressure in the cavity 503 is set to a positive pressure with respect to the atmospheric pressure. With this operation, the superstrate 3 is formed into a convex shape with respect to the substrate 2, so that it can first come into contact with the center of the substrate. This can reduce the air trapped between the superstrate 3 and the composition. A mover 504*a* of a linear motor is fixed to the superstrate chuck 502. The mover 504*a* can move with respect to a stator 504*b* of the linear motor via a spring hinge 505. The position of the linear motor arranged as described above is controlled using a position sensor (not shown). Three sets of the movers 504*a*, the stators 504*b*, the spring hinges 505, and the position sensors are mounted on one planarization head system. With this configuration, in the contact step and the mold separation step, the superstrate chuck 502 is positioned with respect to three axes of Z, θx, and θy in accordance with a predetermined driving profile.

The illumination/spread observation system 410 is arranged above the superstrate 3. The illumination/spread observation system 410 can include an exposure light source, and an optical system for observing the spread state of the composition.

Figure 5:
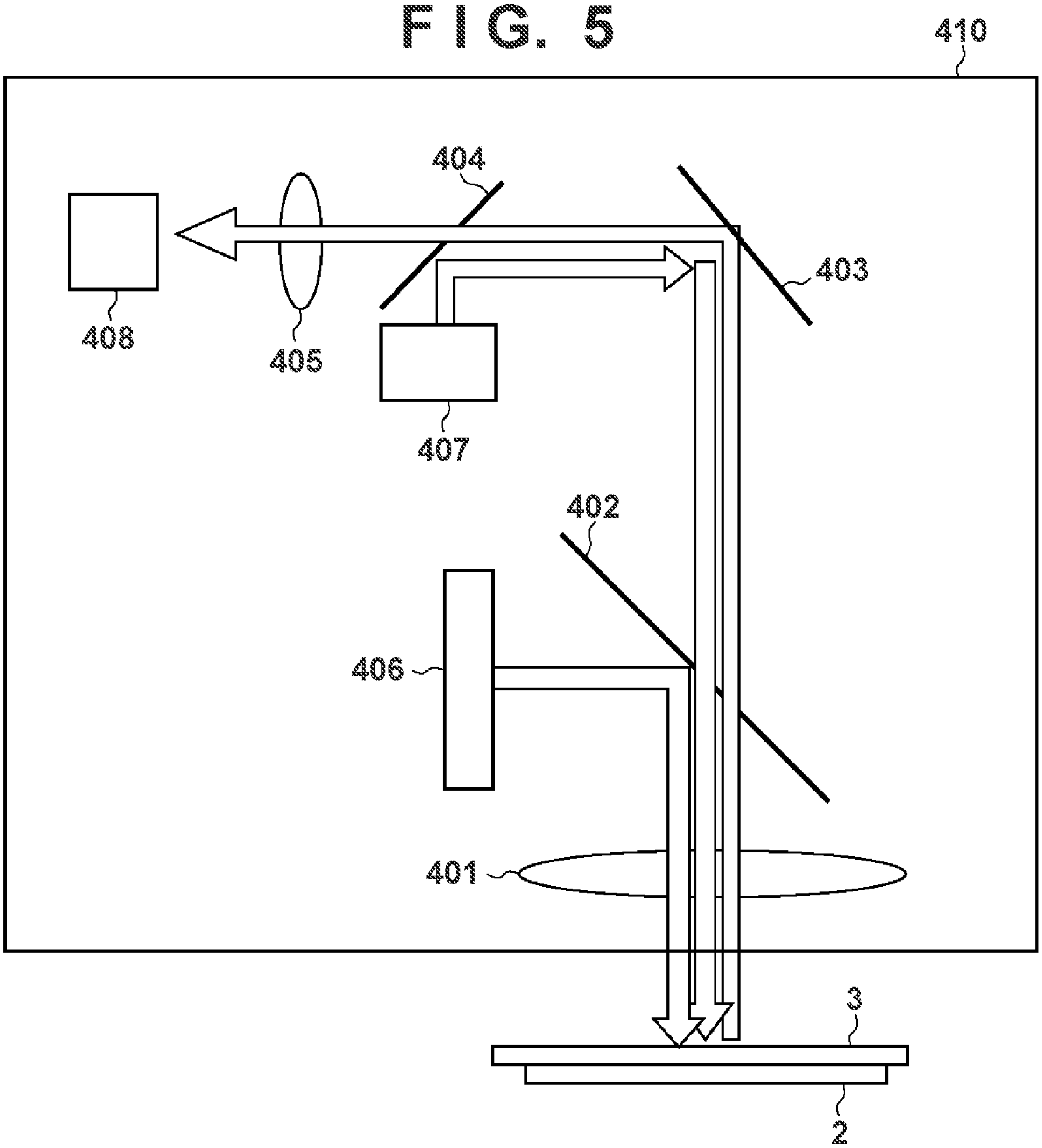
FIG. 5 is a view showing the configuration of an illumination/spread observation system.

FIG. 5 is a view showing a configuration example of the illumination/spread observation system 410. In the contact step, the superstrate 3 is pressed against the composition (the composition ML in FIG. 7A) supplied onto the substrate 2. A light source 406 forming a curing device generates, as exposure light for curing the composition in the state in which the superstrate 3 is in contact with the composition on the substrate 2, ultraviolet light in a wavelength band of, for example, 310 nm to 365 nm. The exposure light from the light source 406 is emitted when spreading (filling) of the composition is complete. The light emitted from the light source 406 is bent to the substrate 2 side by a UV dichroic mirror 402, and expanded, by an objective lens 401, to an illumination region that can sufficiently cover the substrate diameter. In an example, the UV dichroic mirror 402 is transparent to light having a long wavelength of, for example, 400 nm or more which is longer than the wavelength of the exposure light. The long wavelength band is used to observe the spread state of the droplets of the composition on the substrate 2.

Alight source 407 is an illumination light source for spread observation. As light of the light source 407, an appropriate wavelength is selected in accordance with the observation conditions. Examples of the light are red light having a wavelength of 630 nm, green light having a wavelength of 520 nm, and blue light having a wavelength of 470 nm. The light from the light source 407 travels via deflecting mirrors 404 and 403, is transmitted through the dichroic mirror 402, and illuminates the composition on the substrate 2. A camera 408 obtains, via an imaging lens 405, a spread image of the composition on the substrate 2 illuminated by the light source 407. The point where the superstrate 3 starts to come into contact with the composition on the substrate 2 and the shape of the composition can be observed from the spread image. The spread image can be used to optimize the positioning target coordinates of the planarization head system in the θx and θy directions, and optimize the positioning target coordinate in the Z direction. The spread image can also be used to detect a particle and unfilling between the superstrate 3 and the substrate 2 in a normal production process. Hence, the camera 408 can also be used as a protection mechanism for finding a local defective in the planarization process.

FIG. 1 is a view showing the configuration of a planarization apparatus 100 according to this embodiment. A substrate conveyance module 101 is also called an EFEM (Equipment Front End Module). The substrate conveyance module 101 may be formed as a part of the planarization apparatus 100, or may be connected with the planarization apparatus 100 as an apparatus different from the planarization apparatus 100. The substrate conveyance module 101 can include an FOUP (Front Opening Unified Pod) which stores a plurality of substrates (process wafers) and from which the substrate is loaded/unloaded. The substrate conveyance module 101 can also function as an FOUP interface used to exchange the superstrate attached to the planarization head system.

A pre/post-process module 102 can include a PA process module 103 that adjusts the prealignment (PA) state of the substrate 2. In the pre/post-process module 102, for example, the substrate 2 is aligned in the Oz direction using a notch, an orientation flat, or the like formed in the substrate 2. In addition to this, the pre/post-process module 102 can have a function of relaying the superstrate 3 during its conveyance, a function of post-baking the substrate 2 having undergone the planarization process, and the like.

A conveyance robot 110 can transfer the substrate and superstrate to/from the substrate conveyance module 101. Further, the conveyance robot 110 can convey the substrate and the superstrate in the pre/post-process module 102, and convey the substrate, the superstrate, and the substrate chuck in a planarization process module 104.

The planarization process module 104 can include a plurality of planarization head systems (a plurality of processors) P1, P2, and P3, each of which performs the substrate planarization process. The planarization process module 104 is formed by clustering the plurality of processors so that planarization processes can be performed on a plurality of substrates in parallel. In this embodiment, substrate chucks S1, S2, and S3 are assigned to the planarization head systems P1, P2, and P3, respectively. In the planarization process module 104, each of the substrate chucks S1, S2, and S3 is formed to be movable between the corresponding planarization head system and a common space 111.

In this embodiment, each of the substrate chucks S1, S2, and S3 can hold and convey the superstrate in addition to holding the substrate. For example, the substrate can be chucked and held by each of the substrate chucks S1, S2, and S3. On the other hand, the superstrate is placed, in a state in which the surface to come into contact with the substrate faces downward, on lift pins (not shown) protruding from the chuck surface by the conveyance robot 110 such that only the edge portion of the superstrate is held by the lift pins. Thereafter, for each of the planarization head systems P1, P2, and P3, the substrate chuck slowly moves below the planarization head system, and transfers the superstrate with the edge held on the pins to the superstrate chuck 502 of the lowering planarization head.

In the following description, for the sake of descriptive convenience, the superstrate has been loaded in the planarization process module 104 and attached to the superstrate chuck 502 of each of the planarization head systems P1, P2, and P3 before the substrate planarization process is started. Each of the substrate chucks S1, S2, and S3 does not directly include a driving control mechanism for the X and Y directions, and include a θz-direction driving shaft (not shown) alone.

In this embodiment, the substrate chuck of the planarization head system selected from the planarization head systems P1, P2, and P3 can be conveyed in the respective steps of the planarization process. More specifically, the planarization apparatus 100 includes a conveyer that conveys the substrate chuck of the selected processor along a conveyance path including a common conveyance path in the common space 111, which is shared by the planarization head systems P1, P2, and P3. Such the conveyer can include an X slide actuator provided in the common space 111. In this embodiment, the X slide actuator is formed by a linear motor that includes a movable portion 106*a* including an X clutch (first clutch) and a fixed portion 106*b*. The X clutch can be formed by, for example, a magnet or a vacuum suction mechanism.

In FIG. 1, the planarization head systems P1, P2, and P3 are arrayed in a row so as to be in contact with the common space 111, and the common conveyance path is provided so as to extend in the X direction along the row. The common conveyance path is formed by, for example, the fixed portion 106*b* (first guide rail). The movable portion 106*a* is moved by a linear motor driving mechanism (not shown) while being connected with the substrate chuck and guided by the fixed portion 106*b*.

Driving and positioning of each of the substrate chucks S1, S2, and S3 in the X direction are performed when the substrate chuck is connected with the fixed portion 106*b* via the movable portion 106*a*. A Y slide actuator for conveying the substrate chuck is provided below each of the planarization head systems P1, P2, and P3. The Y slide actuator can be formed by a linear motor that includes a guide rail 108*b* (second guide rail) and a Y slider 108*a*. Driving and positioning of each of the substrate chucks S1, S2, and S3 in the Y direction are performed when the substrate chuck is connected with the Y slide actuator. The guide rail 108*b* forms an individual conveyance path which branches from the common conveyance path (fixed portion 106*b*) to each planarization head system. The Y slider 108*a* is moved while being guided by the guide rail 108*b* extending in the Y direction.

A Y clutch 109 (second clutch corresponding to the clutch 9 in FIG. 4) is a clutch that transmits a Y-direction thrust of the substrate chuck when connected with each of the substrate chucks S1, S2, and S3. The Y clutch 109 is fixed to the Y slider 108*a* of each of the planarization head systems P1, P2, and P3. The structure of the clutch will be described later. Note that X-Y driving is never performed in a state in which both of the X clutch of the movable portion 106*a* and the Y clutch 109 are connected with one substrate chuck.

Figure 3A:
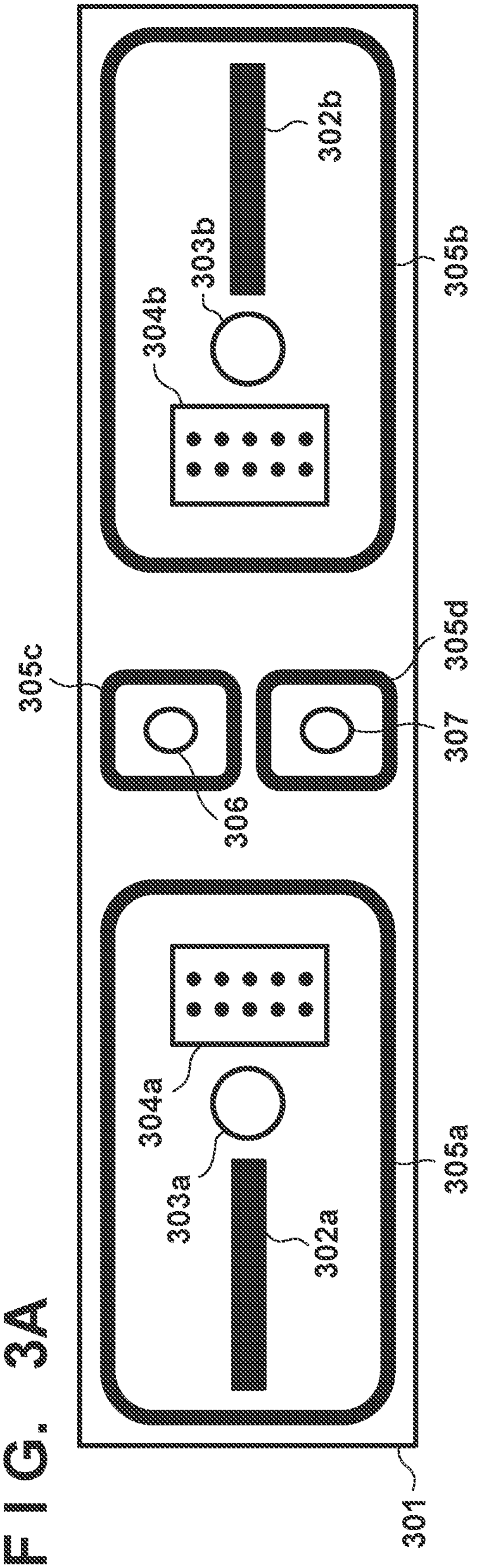
FIGS. 3A and 3B are views showing the arrangements of clutch connection portions.

FIG. 3A is a view showing a connection surface 301 of each of the movable portion 106*a* and the Y clutch 109 with the substrate chuck. Abutting members 302*a* and 302*b* are configured to abut against abutment portions 311*a* and 311*b*, respectively, in a shape extending in the slide direction of each clutch. For example, the abutting members 302*a* and 302*b* of the Y clutch 109, which guides the substrate chuck in the Y direction, are long in the X direction so as to ensure the rigidity in the Y direction and the Oz direction. On the other hand, the Y clutch 109 is configured to follow the base by an air pad on the substrate stage with respect to the θx direction, and maintain (fix) the positional relationship with the Y slider 108*a* at the time of connecting with the substrate chuck with respect to the X, Z, and θy directions.

Vacuum suction holes 303*a* and 303*b* are formed in the connection surface 301, and suction is performed via the suction holes when the clutch is connected. Further, electrodes 304*a* and 304*b*, which are used to drive the actuator of the θ stage arranged on the substrate chuck and transmit/receive sensor signals, are arranged in the connection surface 301. Furthermore, seal members 305*a*, 305*b*, 305*c*, and 305*d* are arranged in the connection surface 301. When connected with the clutch plate on the side of the facing substrate chuck, each of the seal members 305*a*, 305*b*, 305*c*, and 305*d* is compressed by a suction force, and the amount of compression is stably maintained at the position where the abutting members 302*a* and 302*b* abut against the abutment portions 311*a* and 311*b*, respectively. Holes 306 and 307, which communicate with a vacuum tube passing through the substrate lift pins used for chucking of the substrate chuck, are further formed in the connection surface 301.

Figure 3B:
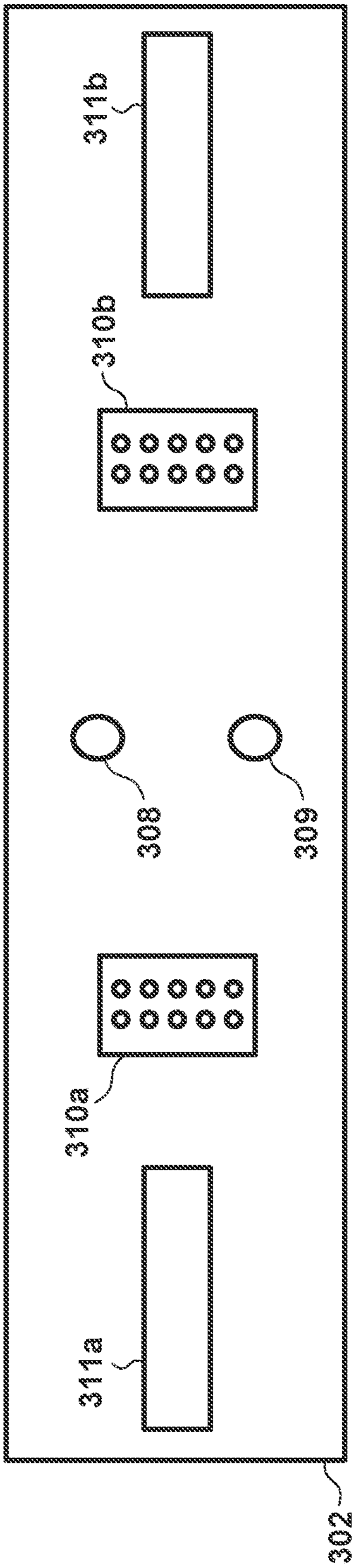

FIG. 3B is a view showing a clutch plate 302 on the substrate chuck side, which faces the contact surface 301 of each of the movable portion 106*a* and the Y clutch 109 shown in FIG. 3A. The abutment portions 311*a* and 311*b* against which the abutting members 302*a* and 302*b* shown in FIG. 3A abut are formed in the clutch plate 302. Electrodes 310*a* and 310*b* are connected with the electrodes 304*a* and 304*b* shown in FIG. 3A, respectively. If a mechanical contact operation is repeated every time the clutch is connected/disconnected, dust can be generated. In order to suck the dust, the abutment portions 311*a* and 311*b* and the electrodes 310*a* and 310*b* are arranged inside the seal members 305*a* and 305*b* shown in FIG. 3A, respectively. Further, vacuum introduction ports 308 and 309 corresponding to the holes 306 and 307 shown in FIG. 3A, respectively, are formed in the clutch plate 302.

A supplier 4 that supplies a UV-curable composition as the planarization material (moldable material) is arranged on the path of movement of the substrate chuck by the movable portion 106*a* along the common conveyance path (fixed portion 106*b*). The supplier 4 is a jetting module corresponding to the dispenser DP shown in FIG. 7A. The supplier 4 includes a driving shaft in the Y direction, and the Y-direction position can be adjusted by a driving mechanism (not shown).

An alignment scope 107 measures alignment marks formed or arranged on the substrate. In an example, the alignment scope 107 can be a binocular alignment scope including a scope 107*a* and a scope 107*b*. The Y-direction positions of the scope 107*a* and the scope 107*b* can be adjusted by a scope driving mechanism (Y shaft) (not shown) based on the designed alignment mark arrangement of the substrate 2. The correction amount in the X direction, the correction amount in the Y direction, and the correction amount in the Oz direction are calculated from the alignment measurement results obtained by observing the alignment marks on the substrate 2. Then, the correction amount in the X direction is reflected on the target value of the movable portion 106*a*, the correction amount in the Y direction is reflected on the target position of the supplier 4, and the correction amount in the Oz direction is reflected on the Oz target position of each of the substrate chucks S1, S2, and S3.

The planarization apparatus 100 can include a controller C that controls the operations of the respective units. The controller C can control a series of sequences according to the substrate planarization process by controlling the operations of the respective units. The controller C can be formed by a computer apparatus including a processor and a memory. The controller C may be provided in the planarization apparatus 100, or may be installed outside the planarization apparatus 100 and control the respective units remotely.

Next, conveyance control of the substrate chucks according to this embodiment will be described. First, the movable portion 106*a* serving as a conveyer conveys the substrate chuck of the selected planarization head system, for example, the substrate chuck S3 (first substrate chuck) of the planarization head system P3 (first processor) to the substrate receiving position in the end portion of the fixed portion 106*b* serving as the common conveyance path. The substrate chuck S3 receives and chucks the substrate 2 (first substrate) loaded to the substrate receiving position by the conveyance robot 110. The movable portion 106*a* holds, by the X clutch, the substrate chuck S3 chucking the substrate 2, and conveys the substrate chuck S3 below the supplier 4. The supplier 4 supplies the composition onto the substrate 2 chucked by the substrate chuck S3. The movable portion 106*a* conveys, to the planarization head system P3, the substrate chuck S3 chucking the substrate 2 with the composition supplied thereon by the supplier 4.

Next, while the planarization head system P3 performs the planarization process on the substrate 2, the process for the next substrate is performed. That is, the movable portion 106*a* conveys the substrate chuck S2 (second substrate chuck) of the planarization head system P2 (second processor) to the substrate receiving position to receive a substrate 2' (second substrate). Then, the substrate chuck S2 with the substrate 2' placed thereon is moved to the planarization head system P2. Subsequently, the substrate chuck S1 with a substrate 2" placed thereon is similarly moved to the planarization head system P1. After that, the substrate 2 having undergone the planarization process is collected by conveying the substrate chuck S3. Thereafter, similarly, the substrate 2' having undergone the planarization process is collected by conveying the substrate chuck S2, and the substrate 2" having undergone the planarization process is collected by conveying the substrate chuck S1. An example in which the substrate chucks S3, S2, and S1 are loaded/unloaded to/from the corresponding planarization head systems, respectively, in this order will be described below. However, the order is merely an example, and another order may be applied.

Figure 2A:
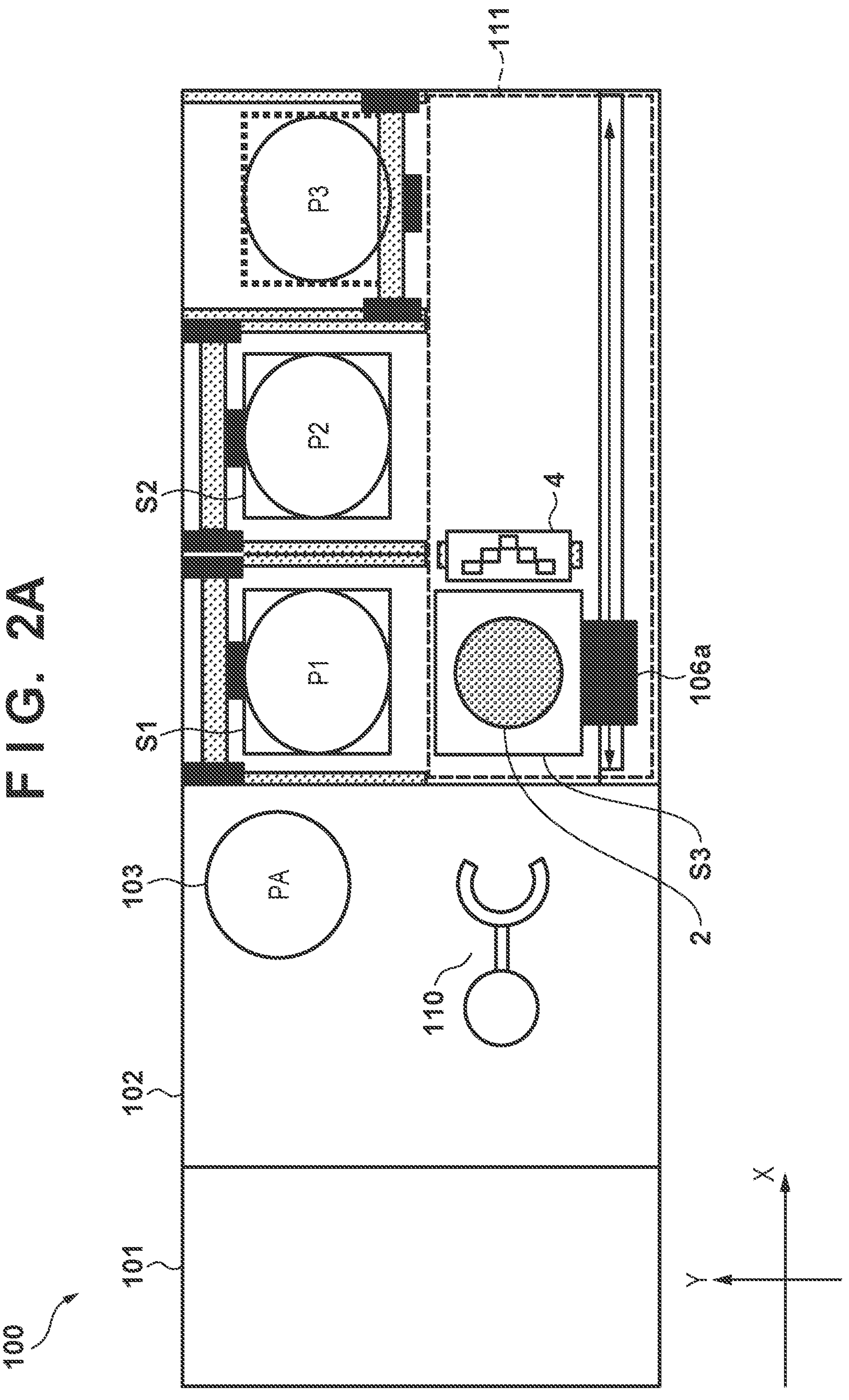
FIGS. 2A to 2P are views for explaining conveyance control of substrate chucks.
Figure 2B:
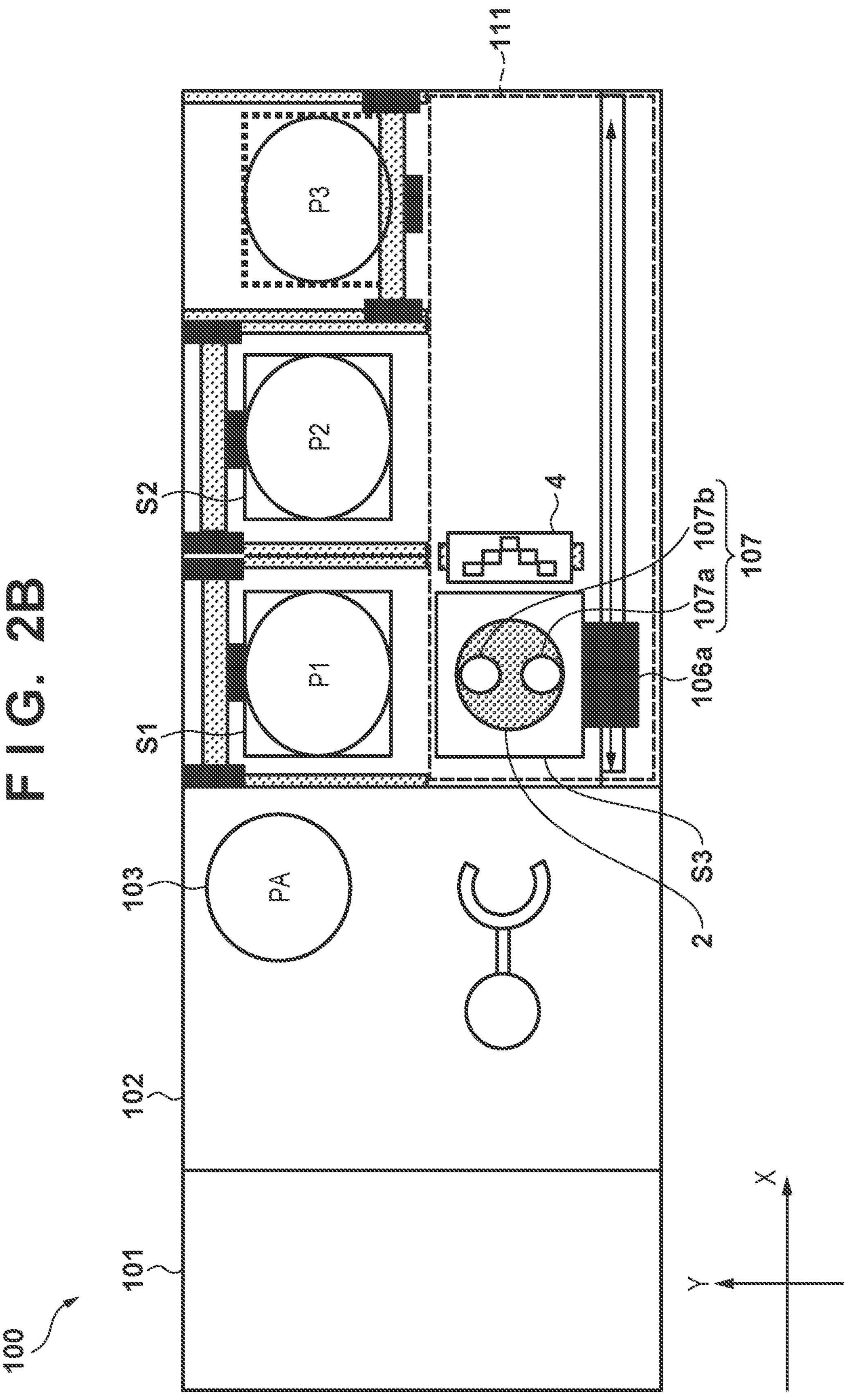
Figure 2C:
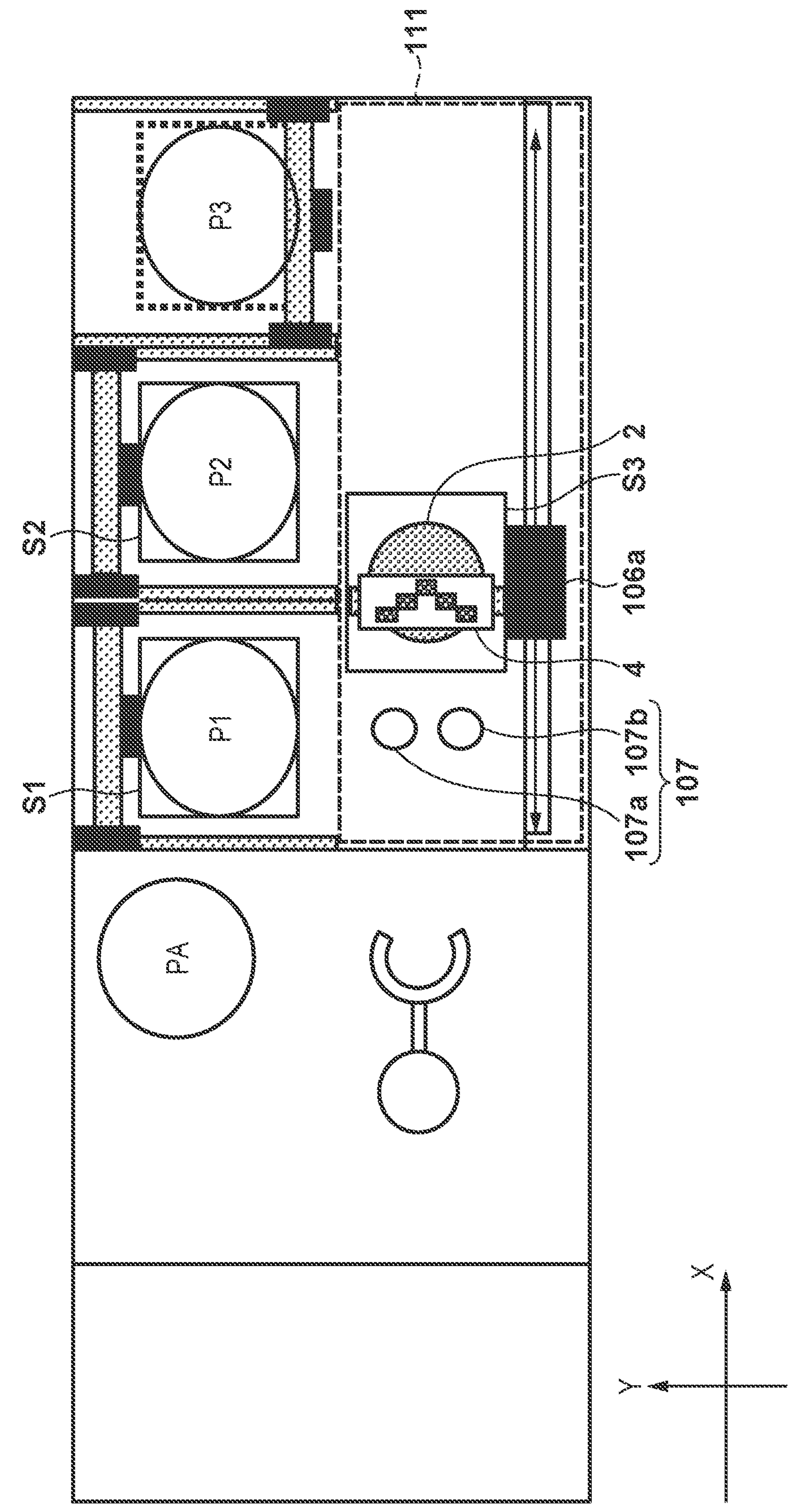
Figure 2D:
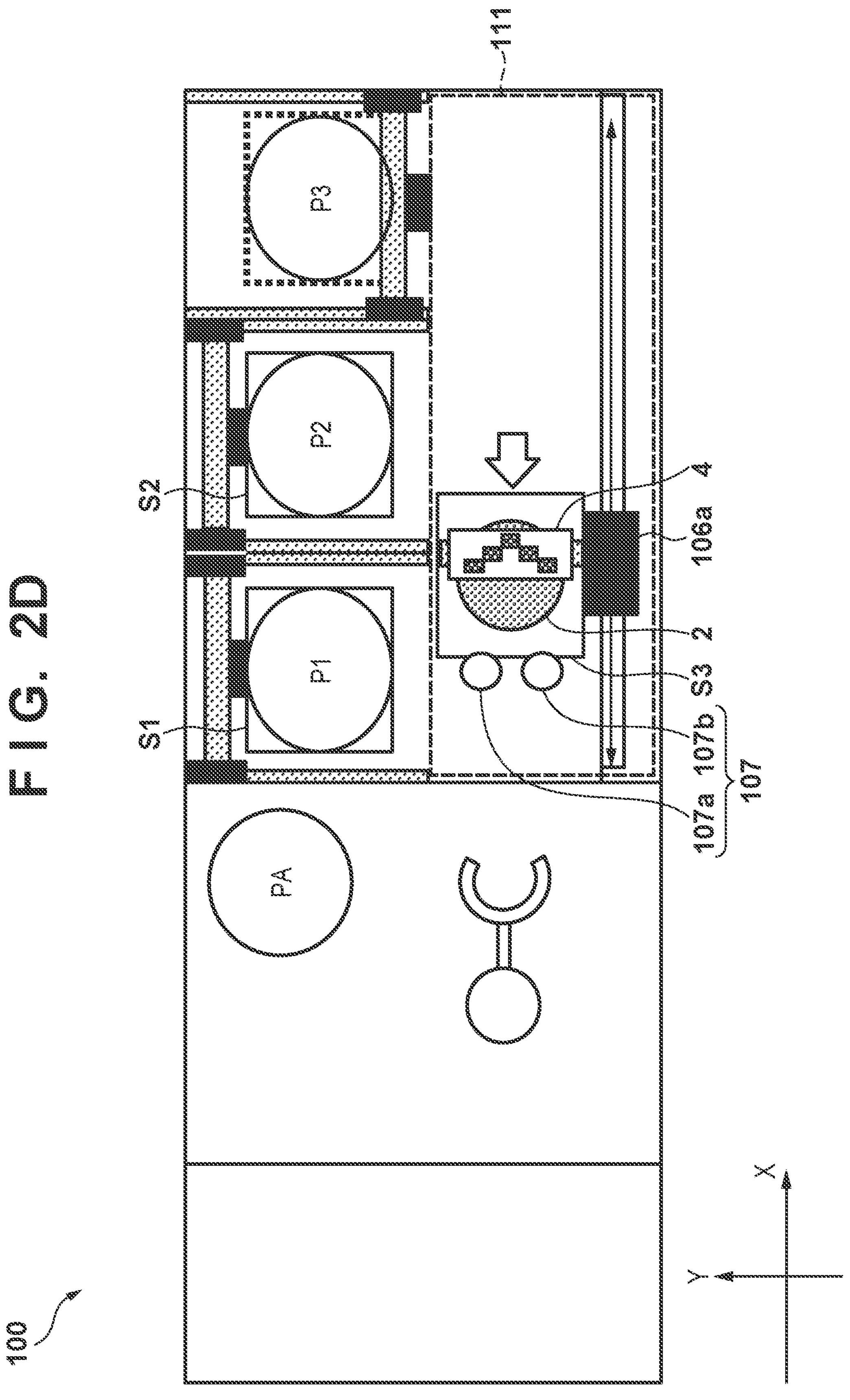
Figure 2E:
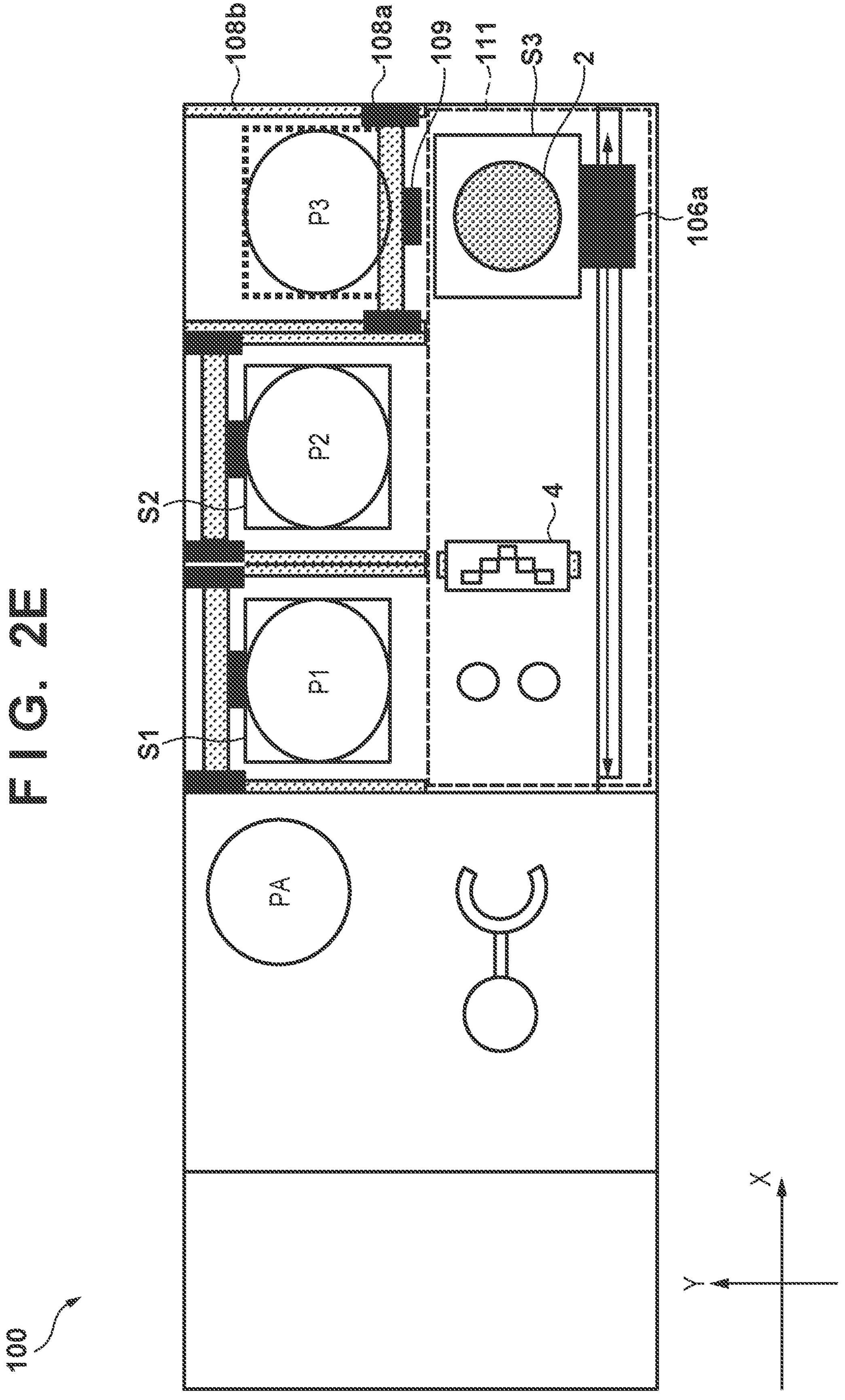
Figure 2F:
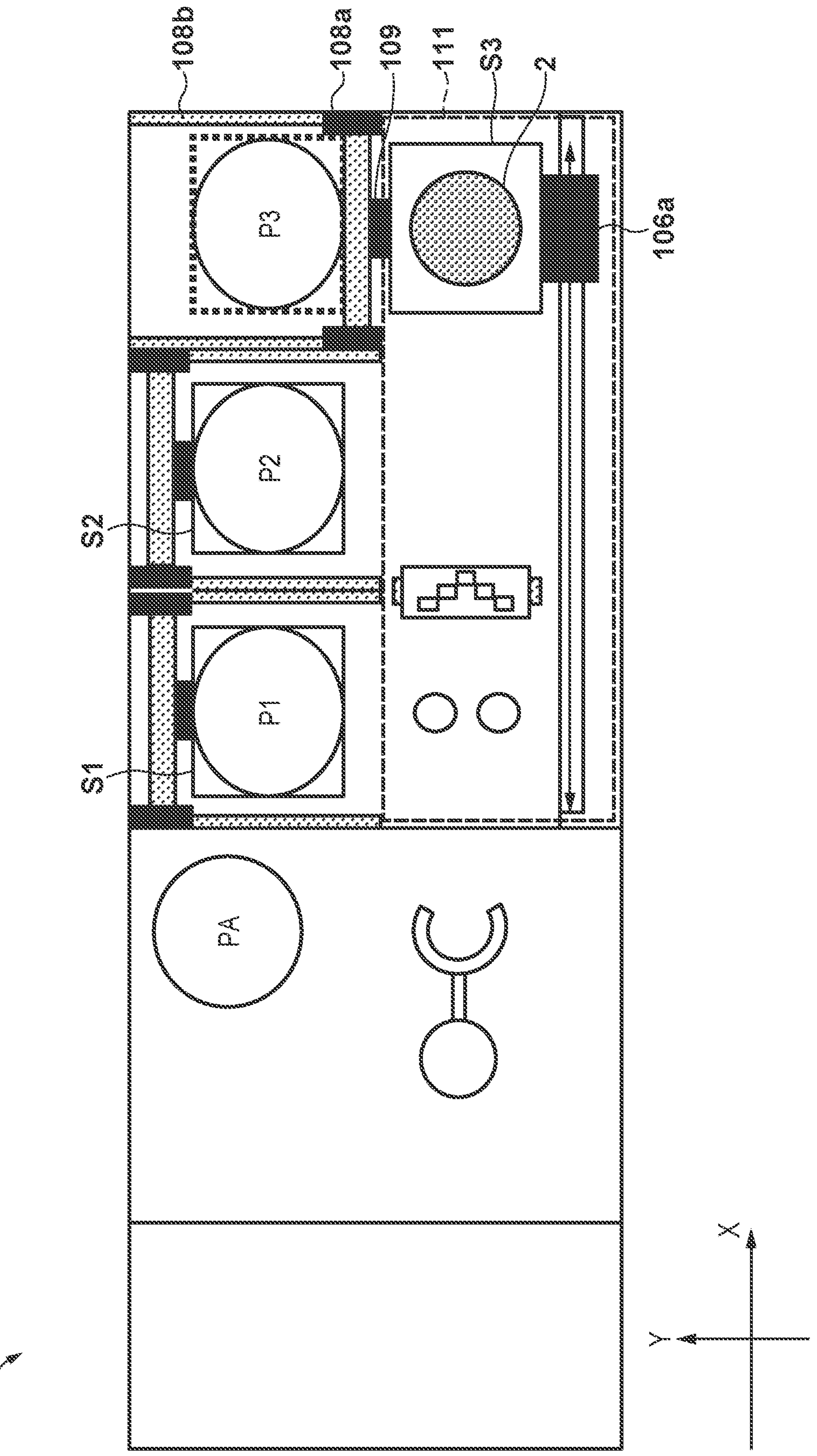
Figure 2G:
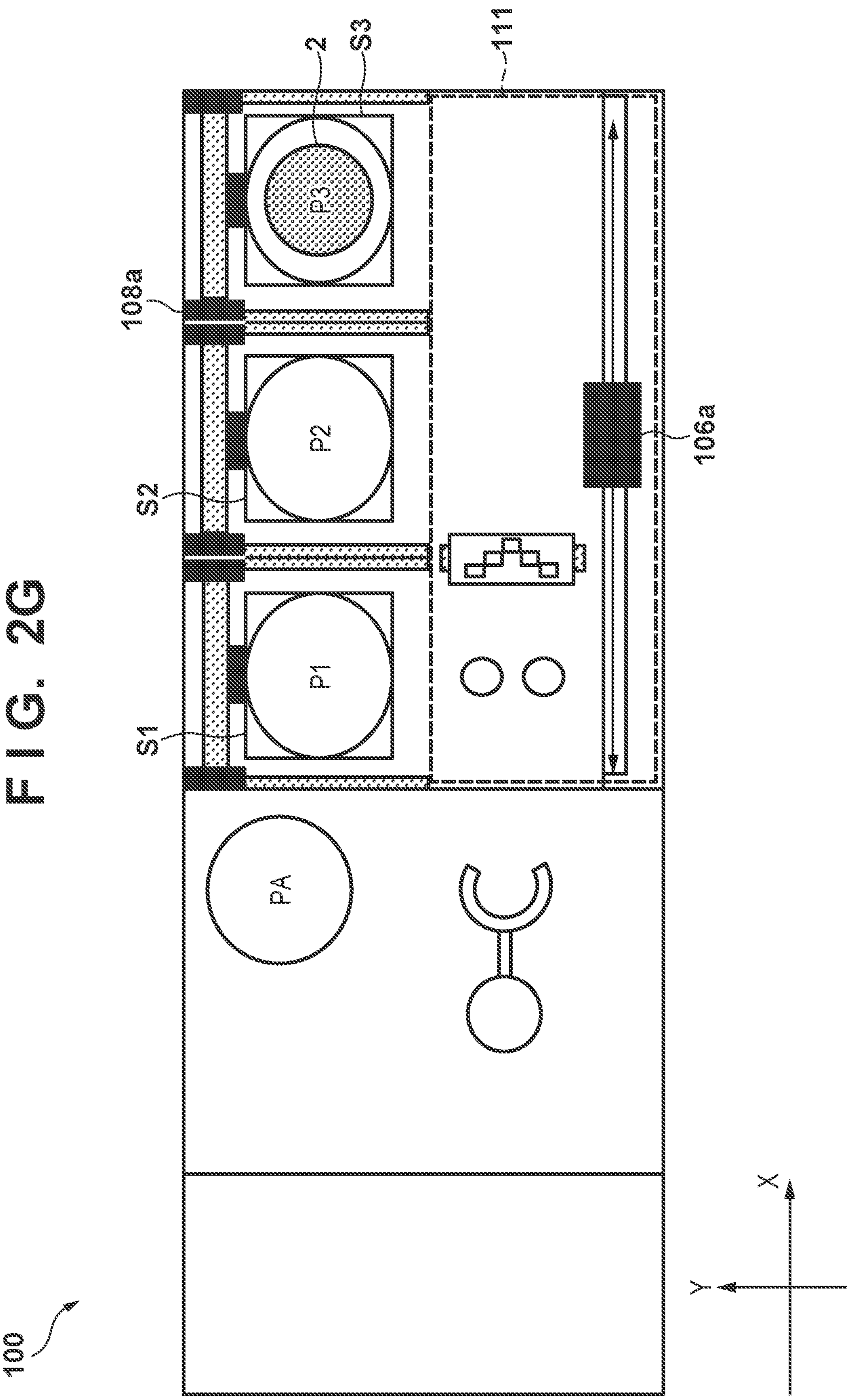
Figure 2H:
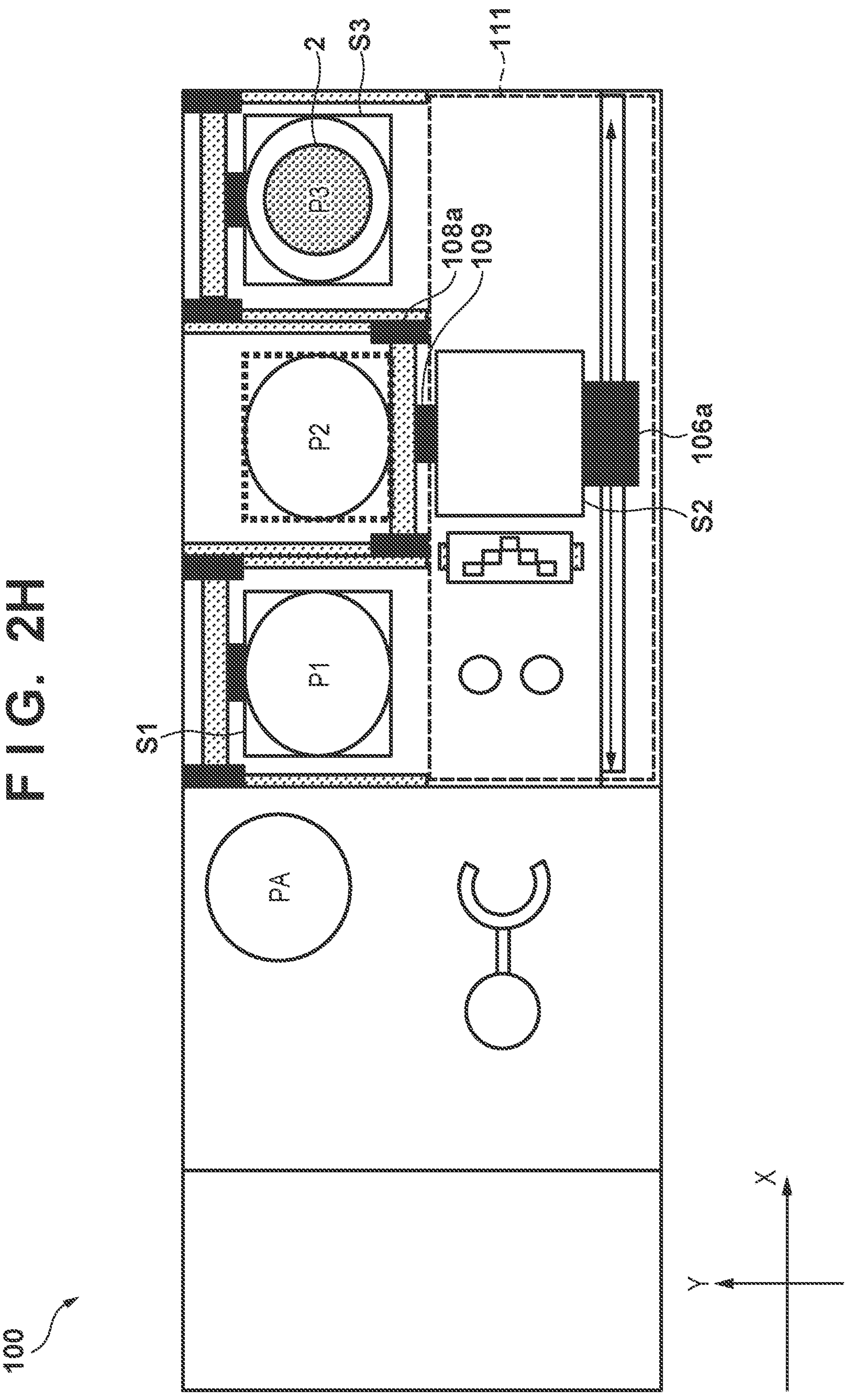
Figure 2I:
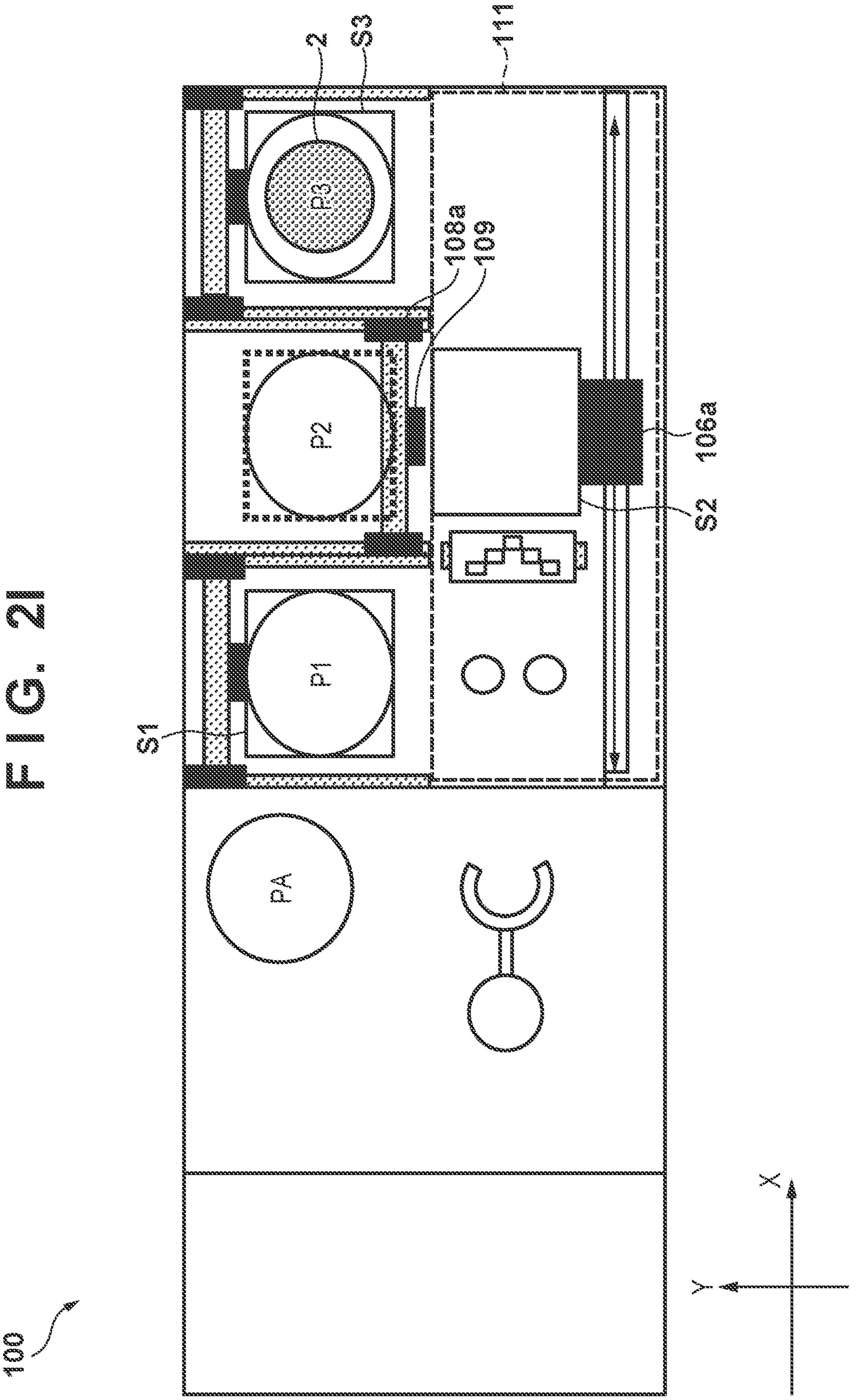
Figure 2J:
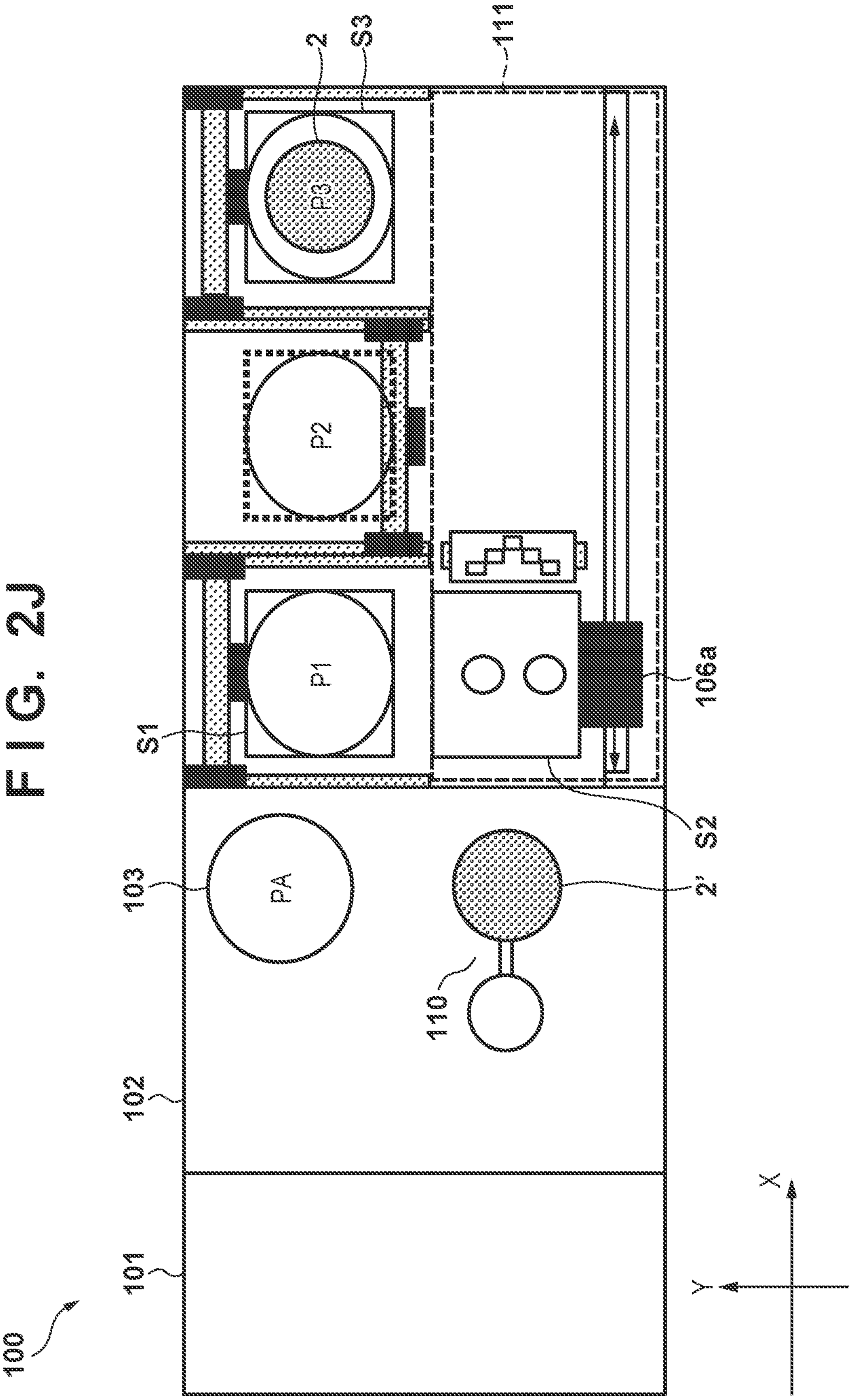
Figure 2K:
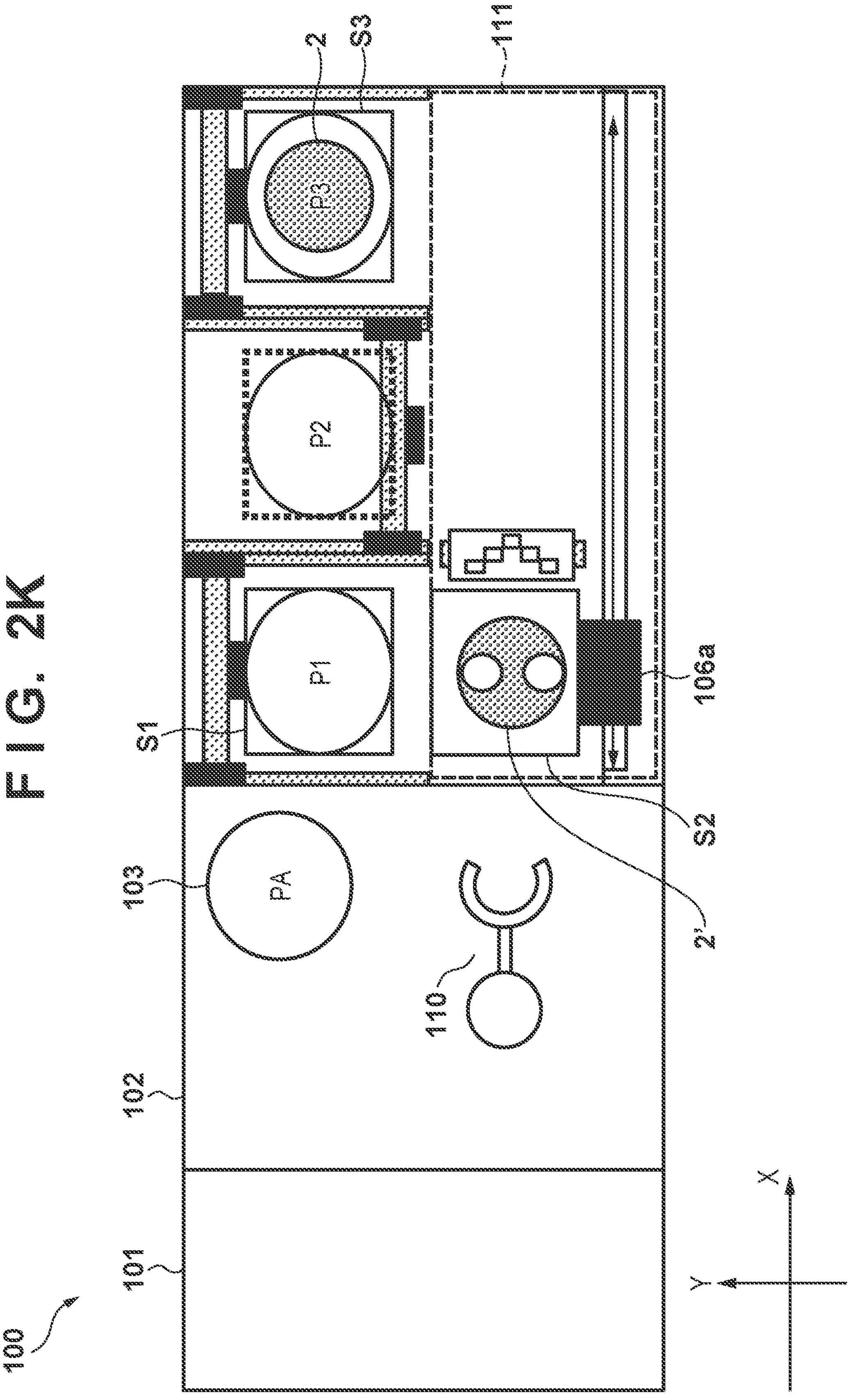
Figure 2L:
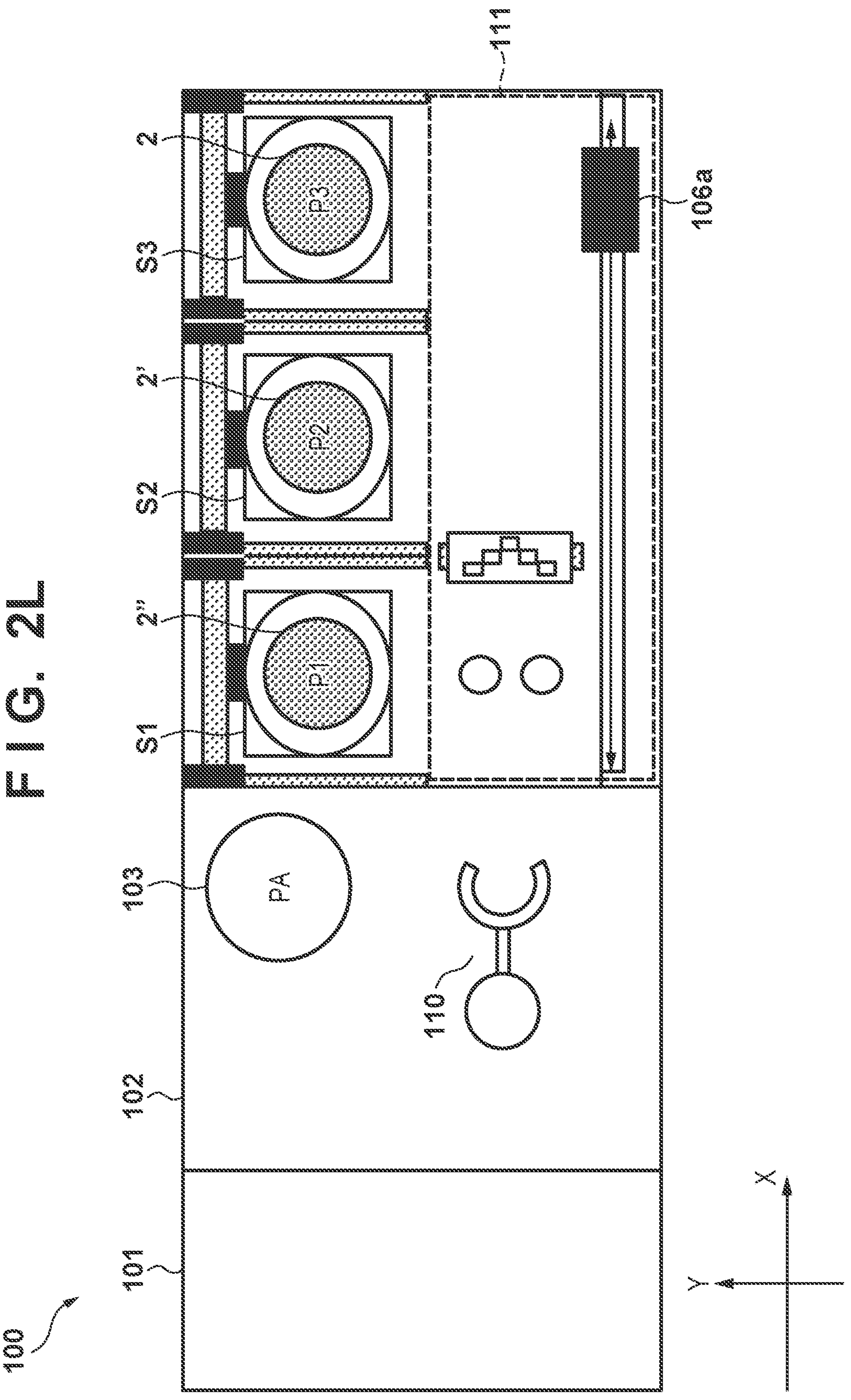
Figure 2M:
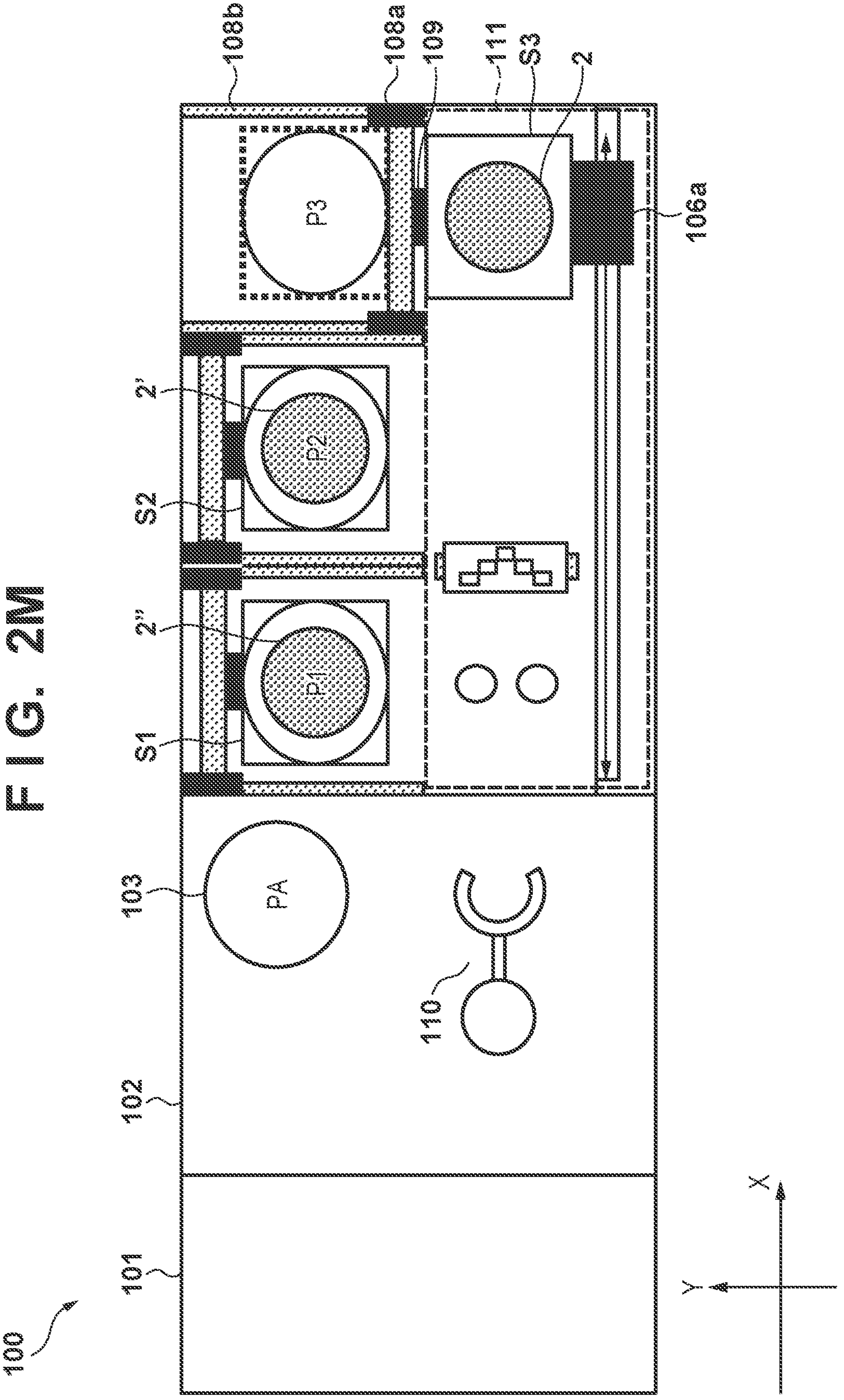
Figure 2N:
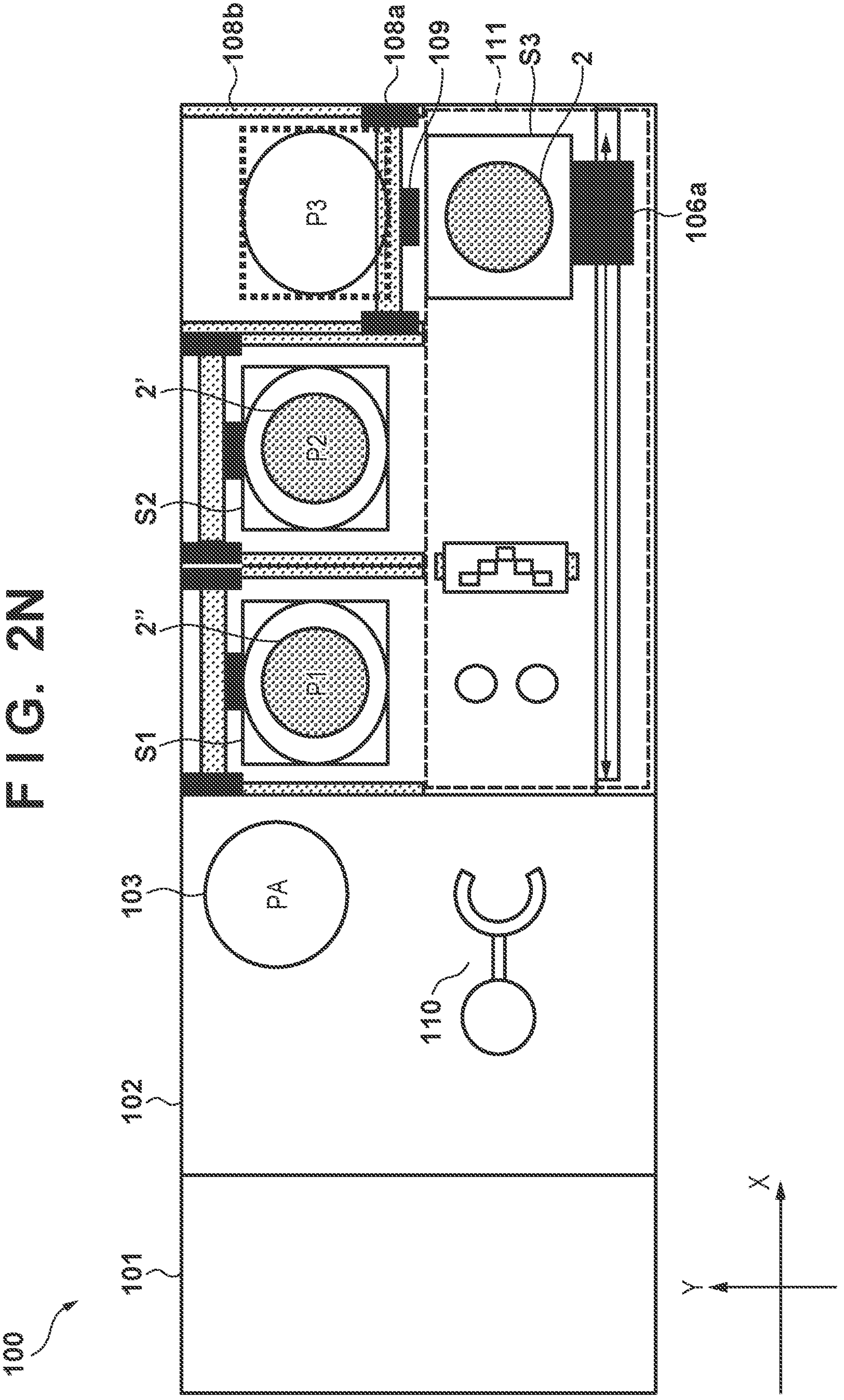
Figure 2O:
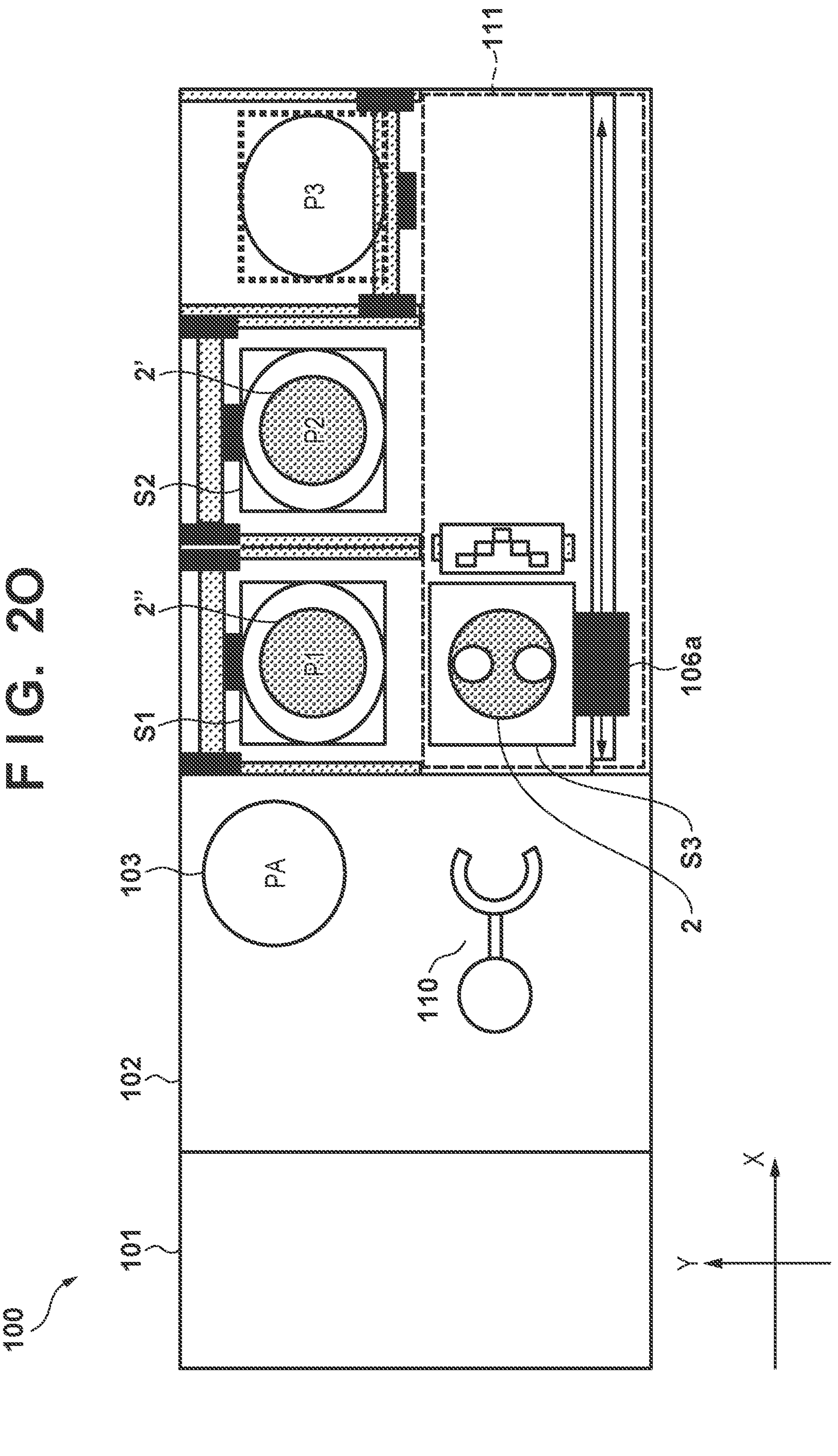
Figure 2P:
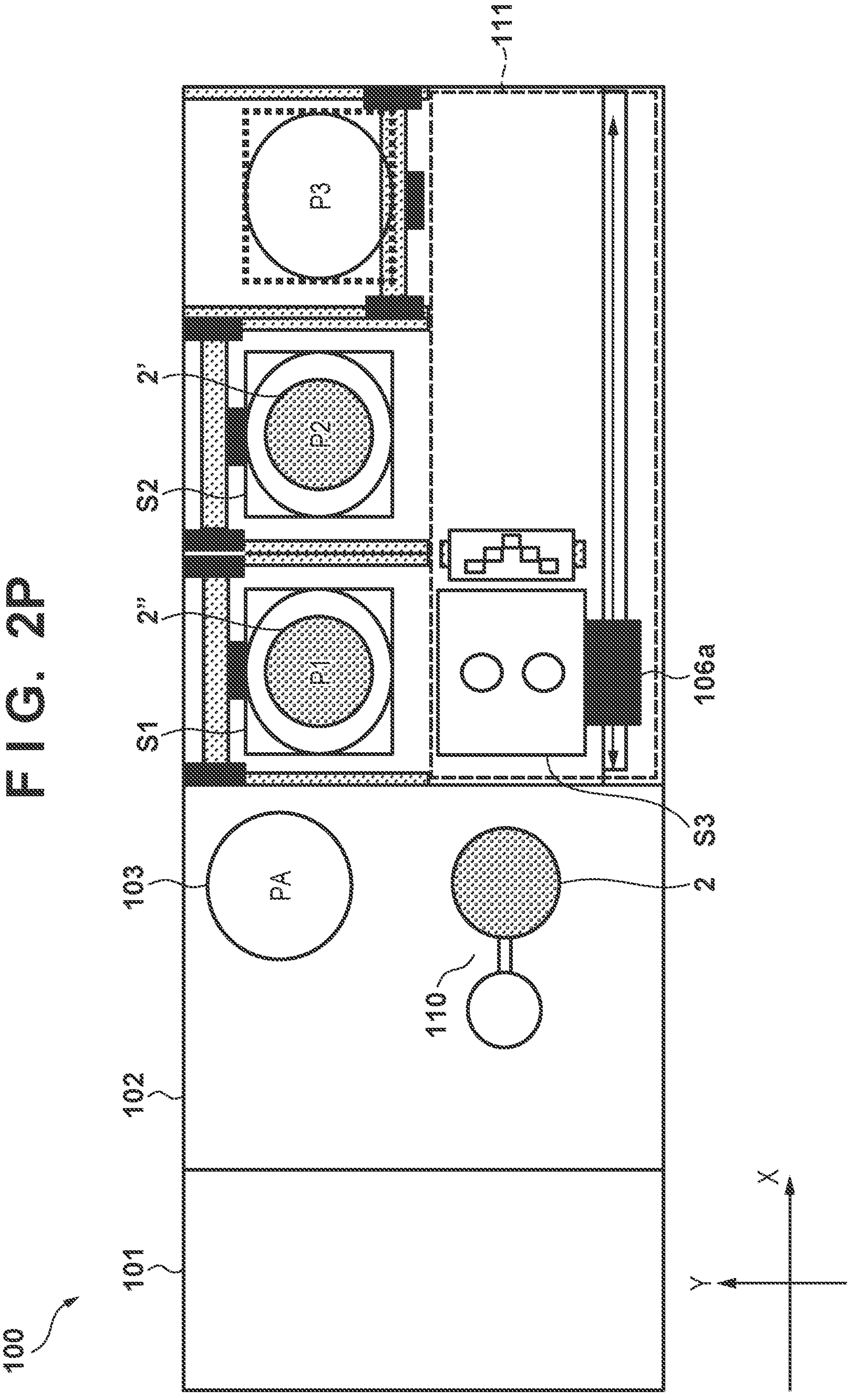

With reference to FIGS. 2A to 2P, a specific example of conveyance control of the substrate chucks, the outline of which has been described in the above paragraph, will be described. FIG. 2A shows a state immediately after the substrate 2 taken out from the substrate conveyance module 101 at the start of the job is prealigned in the PA process module 103, and then transferred to the waiting substrate chuck S3 by the conveyance robot 110. The substrate chuck S3 in this state is fastened to the X clutch of the movable portion 106*a*.

FIG. 2B shows a state in which substrate registration is performed. The substrate registration is a sequence of measuring the position of the substrate 2 with respect to, for example, the apparatus origin defined on the bridge (not shown) suspended above the base. More specifically, the Y-direction positions of the movable portion 106*a* and the scopes 107*a* and 107*b* are adjusted such that the positions of the alignment marks on the substrate 2 fall within the field of view of the alignment scope 107. The X shift amount, the Y shift amount, and the Oz shift amount with respect to the designed position of the substrate 2 are obtained from the alignment image obtained by the alignment scope 107. The shift amounts are measured for each substrate. The obtained shift amounts are reflected on the subsequent composition supply position (coordinates) and the position of the substrate chuck in the contact step.

Each of FIGS. 2C and 2D shows a state in which the composition is supplied onto the substrate 2 by reciprocal scanning and driving of the substrate chuck S3 below the supplier 4. That is, the reciprocal scanning and driving is performed between the state shown in FIG. 2C and the state shown in FIG. 2D for the position of the substrate 2 with respect to the supplier 4. The X shift amount, the Y shift amount, and the Oz shift amount obtained by the substrate registration shown in FIG. 2B are reflected on the driving target value of the movable portion 106*a*, the Y-direction driving target value of the dispenser stage with the supplier 4 mounted thereon, and the Oz driving target value of the substrate chuck S3, respectively. Note that in FIGS. 2C and 2D, the supplier 4 includes an array of five inkjet heads, but the number of the inkjet heads is not limited to this. For example, the number of the inkjet heads may be decreased by changing the Y-direction coordinate of the dispenser stage for each scan to the extent that the tact time required for jetting does not become a rate limiting factor for productivity, and the number of times of scanning and driving of the substrate chuck below the supplier 4 may be increased.

FIG. 2E shows a state in which, after the supply of the composition is complete, the substrate chuck S3 is driven to the clutch switching position. After this, the substrate chuck S3 is returned into the planarization head system P3 as the home position.

FIG. 2F shows a state in which the Y clutch 109 fixed to the Y slider 108*a* is moved to the swap position to receive the substrate chuck S3 from the movable portion 106*a*. In this sequence, the substrate chuck S3 is connected with the Y clutch 109 and, immediately after this, the connection between the substrate chuck S3 and the movable portion 106*a* is released.

FIG. 2G shows a state in which the substrate chuck S3 is guided by the Y clutch 109 connected with the substrate chuck S3, and returned into the planarization head system P3 as the home position. After that, the contact step, the curing step, and the mold separation step are performed by the planarization head system P3. According to the study of the present inventor, the time required for the contact step, the curing step, and the mold separation step is estimated to be about 60 sec although it fluctuates depending on conditions. Accordingly, while the planarization head system P3 performs the planarization process, the common space 111 can be vacated for performing the planarization process in the other planarization head system or collecting the substrate having undergone the planarization process. Vacating the common space 111 means assigning use of the alignment scope 107, the supplier 4, and the movable portion 106*a* in the common space 111 to the other planarization head system. For example, the movable portion 106*a* disconnected from the substrate chuck S3 is moved stepwise to the same X coordinate position as that of the planarization head system P2 as shown in FIG. 2G to prepare for connection with the substrate chuck S2 in the next sequence.

FIG. 2H shows a state in which the substrate chuck S2 of the planarization head system P2 is driven to the swap position of the movable portion 106*a*. At the swap position, the substrate chuck S2 is connected with the movable portion 106*a*.

FIG. 2I shows a state in which the Y clutch 109 is disconnected from the substrate chuck S2 after the substrate chuck S2 is connected with the movable portion 106*a*. In order to ensure a gap for driving the substrate chuck S2 in the X direction, the Y slider 108*a* (that is, the Y clutch 109) retreats in the direction away from the substrate chuck S2.

FIG. 2J shows a state in which the substrate chuck S2 is positioned at the substrate transfer position as in FIG. 2A. At this time, in the pre/post-process module 102, the hand of the conveyance robot 110 is waiting while grasping the prealigned substrate 2'.

Note that as the processes of multiple substrates advance as described above, the substrate chuck holding the substrate having undergone the planarization process comes back. At this time, a collection hand (not shown) mounted on the conveyance robot 110 first collects the processed substrate. Once the substrate chuck S2 becomes a state in which no substrate is placed thereon since the substrate is collected or the like, the substrate chuck S2 receives the substrate 2' as the next process target from the conveyance robot 110. FIG. 2K shows a state in which the substrate 2' is placed on the substrate chuck S2 by the conveyance robot 110.

FIG. 2L shows a state in which the substrate chuck S2 holding the substrate 2' has returned to the planarization head system P2, and the substrate chuck S1 holding the substrate 2" has returned to the planarization head system P1. For the substrate 2' and the substrate 2", the process from the state shown in FIG. 2K to the state shown in FIG. 2L is similar to the process from the state shown in FIG. 2B to the state shown in FIG. 2G showing the movement of the substrate chuck S3, so that the detailed description thereof will be omitted.

FIG. 2M shows a sequence of collecting the substrate 2 from the state (FIG. 2L) in which the planarization process in the planarization head system P3 is complete. The substrate chuck S3 is driven to the swap position with the movable portion 106*a* by driving of the Y slider 108*a* of the planarization head system P3, and the substrate chuck S3 is connected with the movable portion 106*a*. In FIG. 2N, after the substrate chuck S3 is connected with the movable portion 106*a*, the connection between the substrate chuck S3 and the Y clutch 109 is released. In order to ensure a gap for driving the substrate chuck S3 in the X direction, the Y slider 108*a* (that is, the Y clutch 109) retreats in the direction away from the substrate chuck S3.

FIG. 2O shows a state in which the substrate chuck S3 is positioned at the substrate transfer position as in FIG. 2A. At this time, in the pre/post-process module 102, the hand of the conveyance robot 110 is waiting while holding the fourth substrate (not shown) having undergone prealignment in the PA process module 103. The collection hand (not shown) mounted on the conveyance robot 110 collects the processed substrate 2 chucked by the substrate chuck S3 (FIG. 2P). After this, the fourth substrate as the process target is transferred to the substrate chuck S3.

Since the process of collecting each of the substrate 2' and the substrate 2" is performed similarly to the processes shown in FIGS. 2M to 2P, the details of the process will be omitted. However, a chart summarizing the movements in the processes is shown in FIGS. 6A and 6B.

Figure 6A:
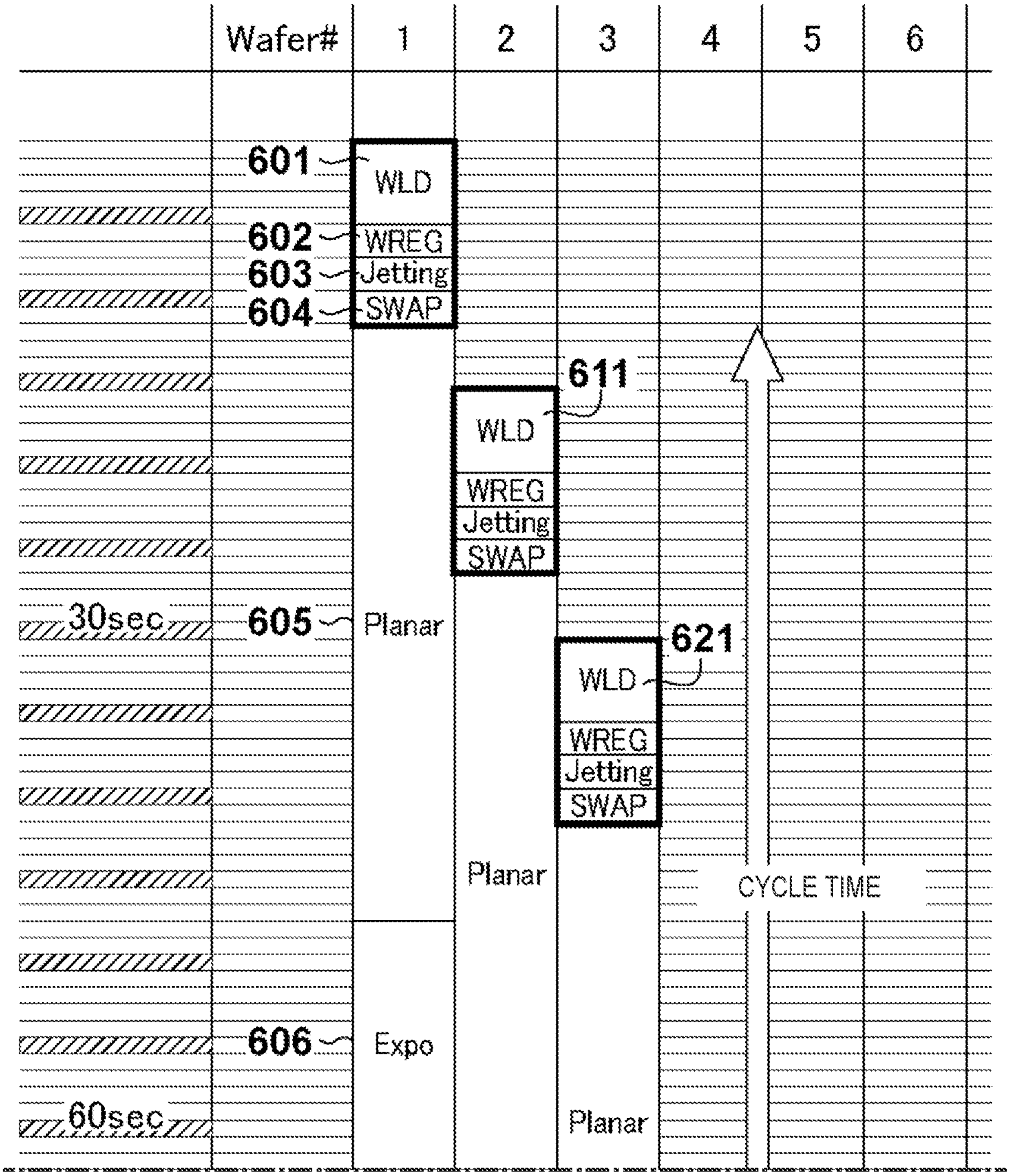
FIGS. 6A and 6B are timing charts showing parallel processing of planarization processes.
Figure 6B:
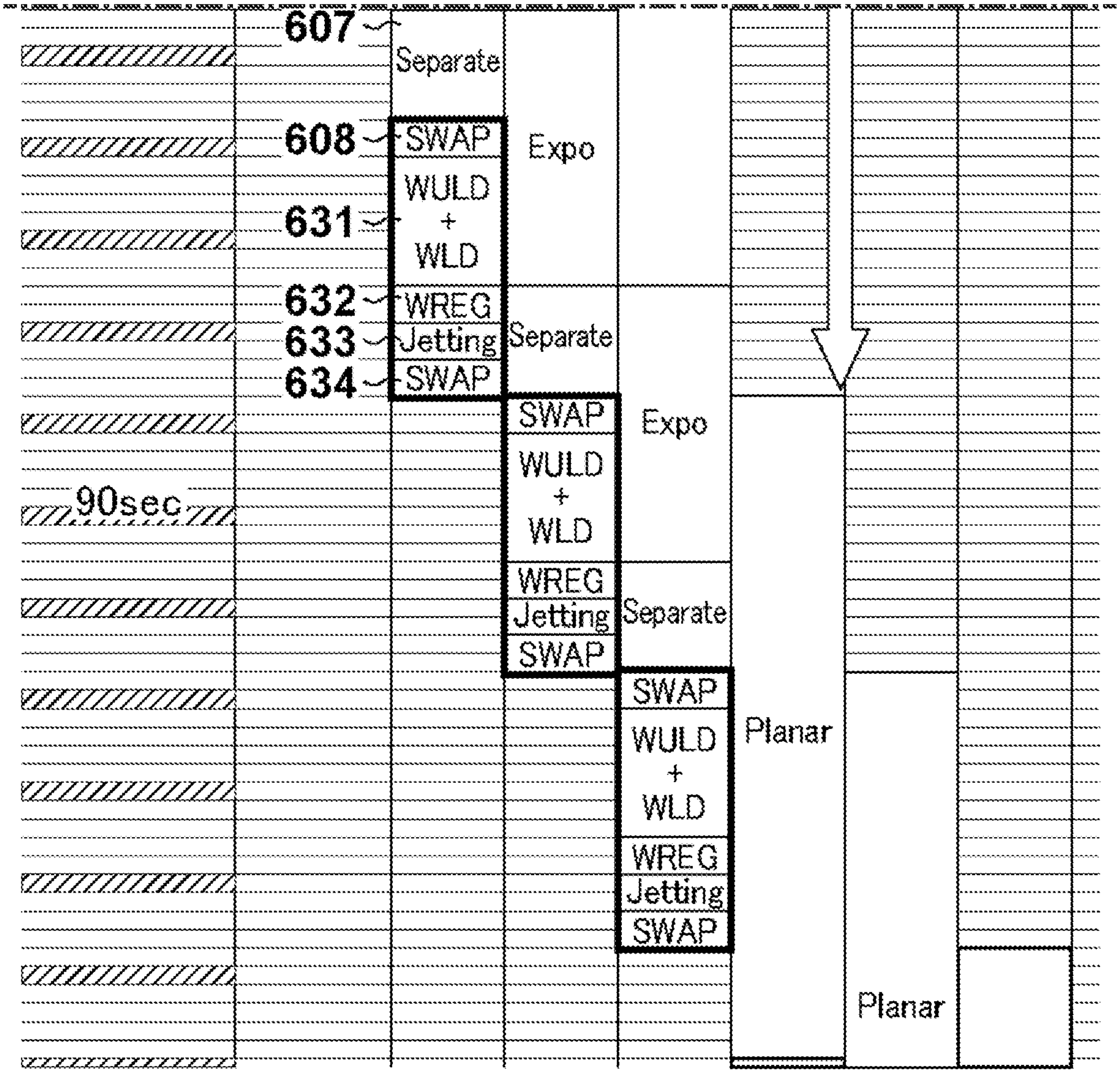

FIGS. 6A and 6B are timing charts showing parallel processing of the planarization processes shown in FIGS. 2A to 2P. In FIGS. 6A and 6B, "Wafer#" indicates the number of the substrate as the process target. Here, an example is shown in which four substrates #1 to #4 are processed in parallel.

WLD 601 indicates the load time for loading the first substrate from the hand of the conveyance robot 110 to the substrate chuck S3.

WREG 602 indicates the registration measurement time, using the alignment scope 107, of the substrate chucked by the substrate chuck S3.

Jetting 603 indicates the time for supplying, by the supplier 4, the composition onto the substrate chucked by the substrate chuck S3 (the time required for reciprocal scanning).

SWAP 604 indicates the time for swapping the substrate S3 from the movable portion 106*a* to the Y clutch 109.

Planar 605 indicates the time (contact/filling time) of the contact step by the planarization head system P3.

Expo 606 indicates the time (exposure time) of the curing step by the planarization head system P3.

Separate 607 indicates the time of the mold separation step by the planarization head system P3.

SWAP 608 is the time for guiding the substrate chuck S3 to the X slider driving region by the Y clutch 109 and swapping the substrate chuck S3 from the Y clutch 109 to the movable portion 106*a*.

WULD+WLD 631 indicates the unload/load time of collecting the first substrate from the substrate chuck S3 and loading the fourth substrate to the substrate chuck S3 by the conveyance robot 110.

WREG 632, Jetting 633, and SWAP 634 are similar to the above-described WREG 602, Jetting 603, and SWAP 604, respectively.

Since the processes in the common space 111 conflict between multiple substrate processes, it is required that the timings of WLD 601 to SWAP 604 and SWAP 608 to SWAP 634 for the respective substrates do not overlap each other. A timing 611 of loading the second substrate 2' to the substrate chuck S2 by the conveyance robot 110 is scheduled from the timing (SWAP 634) of loading the fourth substrate to the planarization head system P3. This also applies to a timing 621 of loading the third substrate 2" to the chuck S1 by the conveyance robot 110.

Since the planarization apparatus 100 according to this embodiment incorporates three planarization head systems, three substrates constitute one process cycle. The substrate productivity of the planarization apparatus 100 can be decided by the cycle time shown in FIGS. 6A and 6B from loading the first substrate to the planarization head system P3 to loading the fourth substrate to the planarization head system P3. According to the case shown in FIGS. 6A and 6B, since the cycle time is about 72 sec, the substrate productivity is 3 substrates/72 sec=150 wph. "wph" indicates the number of substrates processed per hour (wafers/hour).

Each of Planar 605 indicating the time of the contact step, Expo 606 indicating the time of the curing step, and Separate 607 indicating the mold separation step is a process recipe parameter whose optimal value changes in accordance with the viscosity of the composition ML and a profile change in the contact step. According to the case shown in FIGS. 6A and 6B, 57 sec of the cycle time (72 sec) corresponds to Planar 605, Expo 606, and Separate 607. The remaining 15 sec corresponds to SWAP 608, WULD+WLD 631, WREG 632, Jetting 633, and SWAP 634.

Figure 8:
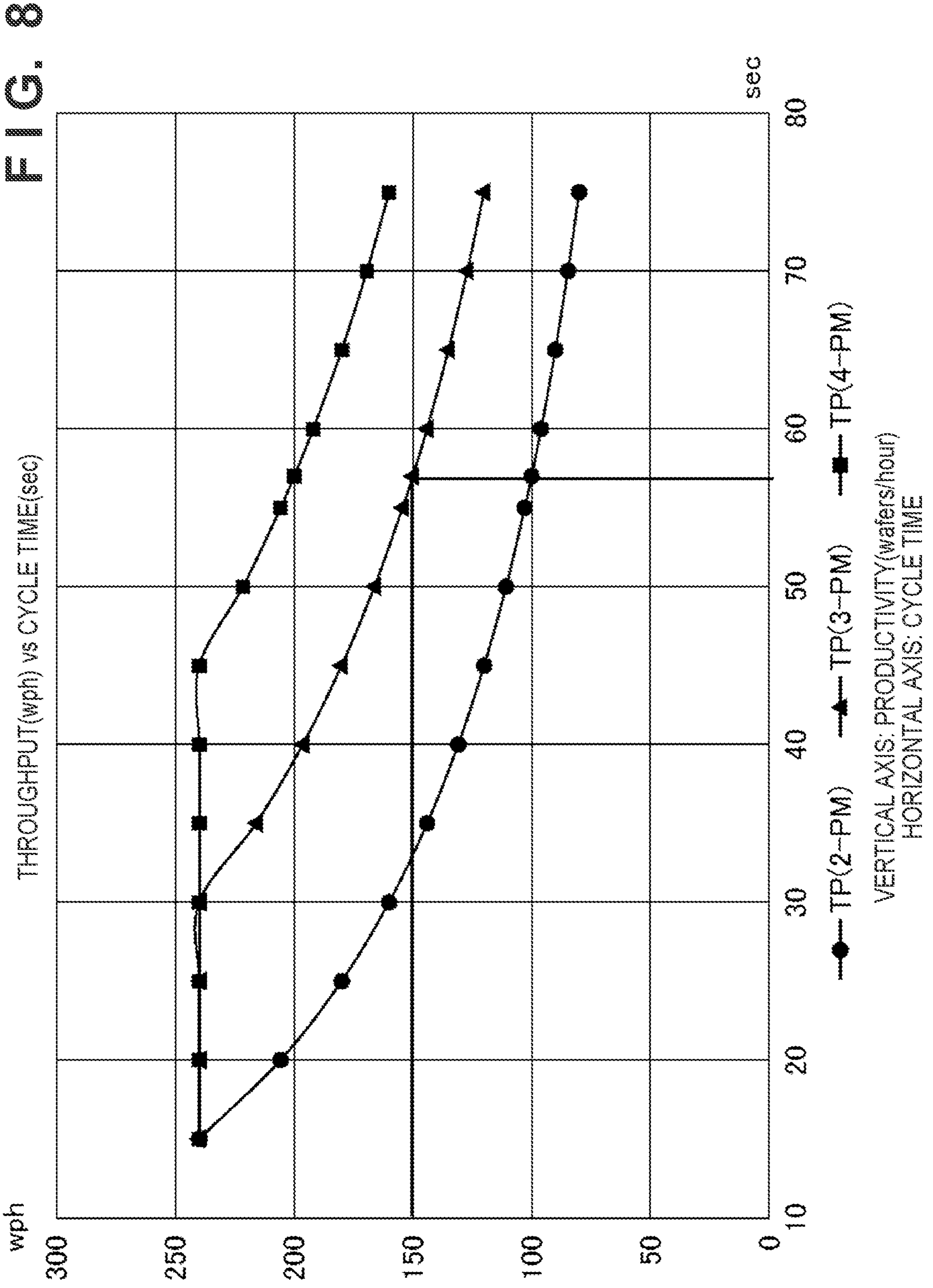
FIG. 8 is a graph showing the relationship between the number of the planarization head systems and the productivity.

FIG. 8 is a graph showing the relationship between the number of the planarization head systems included in the planarization process module 104 and the productivity (throughput). The abscissa represents the tact time of the planarization head system that can change in accordance with the process recipe parameters, and the ordinate represents the number of substrates processed per hour (wph) as the throughput (TP). "TP(2-PM)" indicates the throughput with two planarization head systems, "TP(3-PM)" indicates the throughput with three planarization head systems, and "TP(4-PM)" indicates the throughput with four planarization head systems.

The productivity can be decided depending on the number of planarization head systems, the tack time of each planarization head system, and the tack time required for the processes in the common space 111 (that is, loading/unloading of the substrate), substrate registration, supply of the composition, and clutch switching. The productivity reaches its peak at 240 wph because the tack time for the shared Y-direction stage, alignment scope 107, and supplier 4 is defined to be about 15 sec in this embodiment.

According to the first embodiment described above, the substrate chuck is conveyed along the common conveyance path together with the substrate, and the respective steps of the planarization process are performed on the substrate chucked by the substrate chuck. Therefore, it is unnecessary to include a conveyance robot that conveys the substrate between the modules, and this simplifies the apparatus configuration. In addition, since the substrate is not transferred between the substrate chuck and the conveyance robot in each planarization processor, the productivity (throughput) also improves. In these respects, this embodiment is advantageous in both maintaining the high productivity in the cluster configuration of the planarization apparatus and decreasing the complexity of the apparatus system.

Second Embodiment

Figure 9:
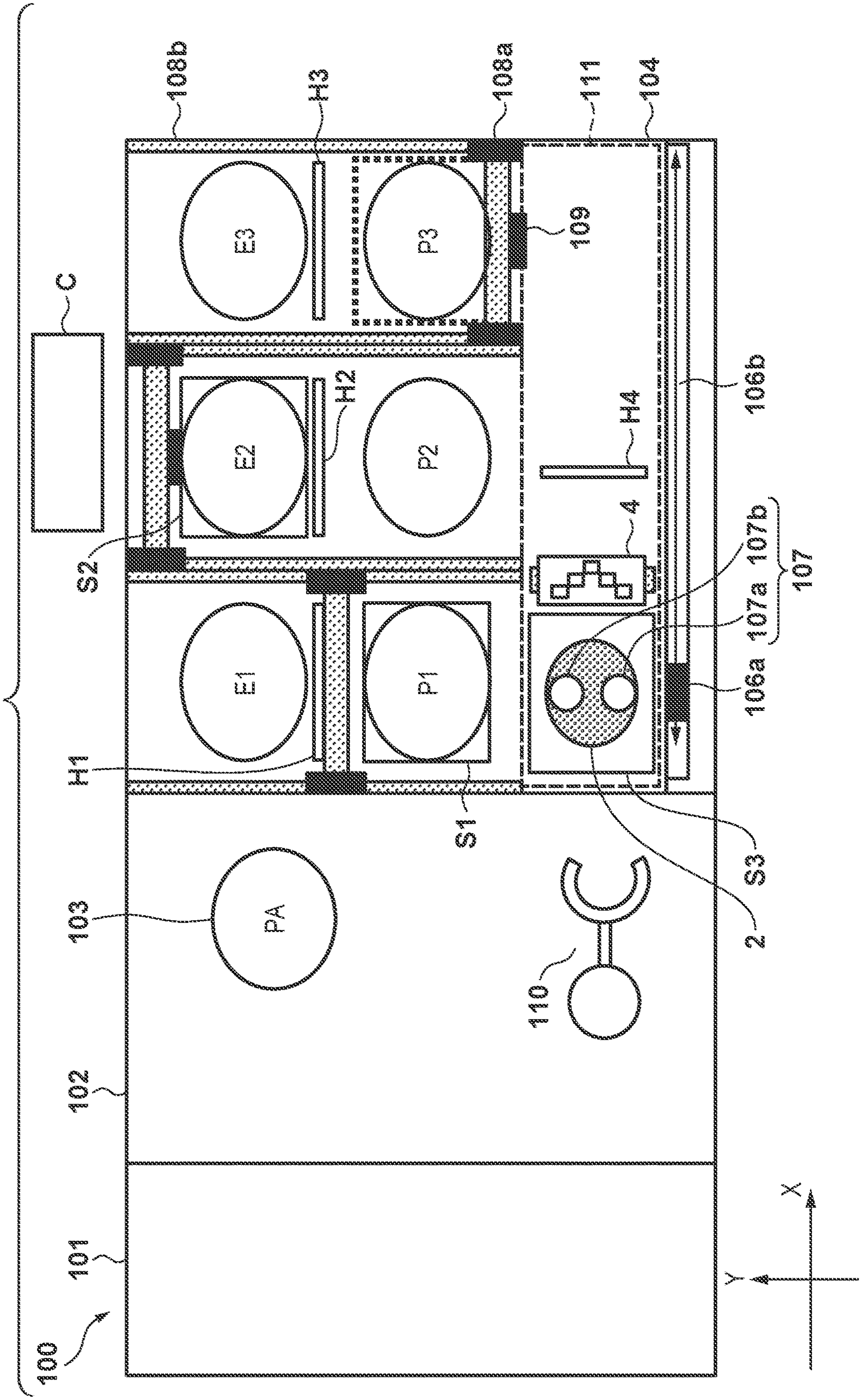
FIG. 9 is a view showing the configuration of a planarization apparatus.

In the second embodiment, a plurality of curing devices are arranged at positions different from planarization head systems P1, P2, and P3. FIG. 9 is a view showing the configuration of a planarization apparatus 100 according to the second embodiment. In FIG. 9, as compared to the configuration shown in FIG. 1, the stroke of a guide rail 108*b* of the Y slide actuator is extended, and a UV irradiation position by a light source 406 is provided at the end (the upper side in the drawing surface) of the stroke. That is, in the example shown in FIG. 9, a curing step is performed at positions different from the planarization head systems P1, P2, and P3. With this configuration, it is easy to design the outer dimension of a superstrate 3 to have the same size (for example, 300 mm) as the substrate. Therefore, the same infrastructure as the substrate can be used for cleaning, coating, and conveyance by the FOUP/FOSB (Front Opening Shipping Box) of the superstrate 3.

The outline of the planarization processes in the configuration shown in FIG. 9 is as follows.

In the sequence indicated as "Planar" such as "planar 605" in FIGS. 6A and 6B, the contact step is performed on the substrate with the composition supplied thereon. After that, the superstrate 3 is dechucked from a superstrate chuck 502, and the superstrate is completely placed on the substrate cucked by one of substrate chucks S1/S2/S3 via the composition. In this state, each of the substrate chucks S1/S2/S3 is moved below a corresponding one of light sources E1/E2/E3, and a curing step (UV exposure) is performed. Each of the light sources E1/E2/E3 may be a surface-emitting type light source. Alternatively, rod light sources H1/H2/H3 may be arranged, and the substrate chucks S1/S2/S3 may be scanned and exposed in the Y direction.

Alternatively, a light source H4 for scanning exposure may be arranged in a common space 111 instead of the light sources H1/H2/H3 as shown in FIG. 9. If the number of planarization head systems is small and the productivity is not a problem, the apparatus cost can be reduced with the configuration as described above. The substrate chucks S1/S2/S3 having undergone exposure (curing step) are returned below the corresponding planarization head systems P1/P2/P3 again, the superstrate chuck 502 chucks the superstrate 3 again, and then a mold separation step is performed. The subsequent process sequences are similar to those in the first embodiment.

Third Embodiment

Figure 10:
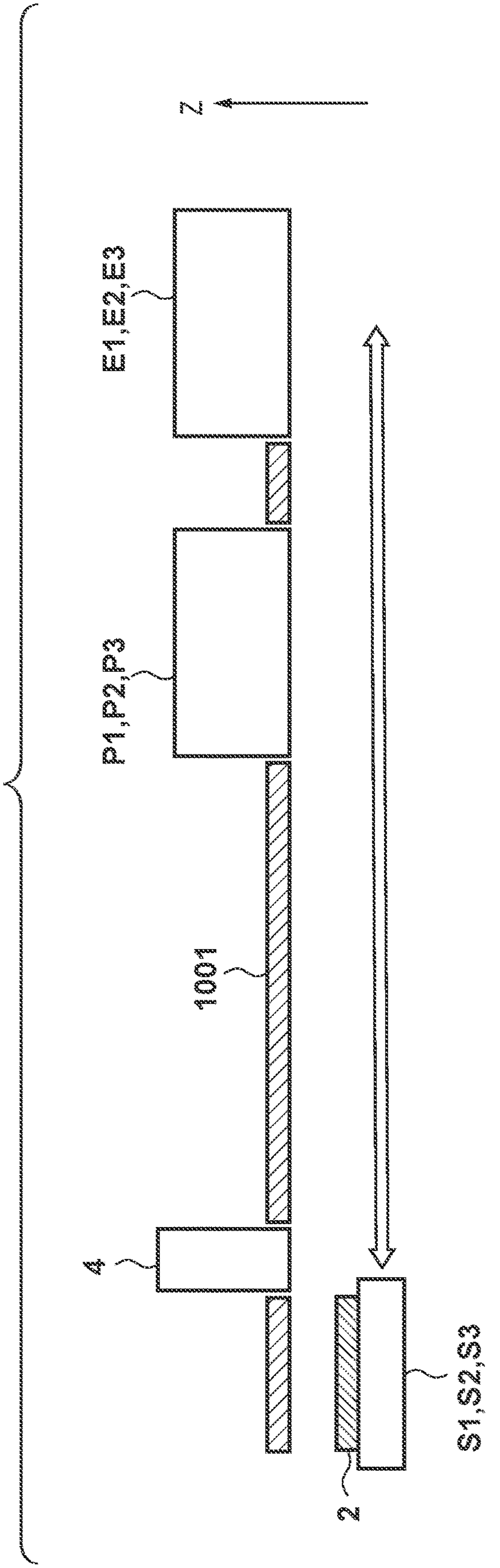
FIG. 10 is a view showing the configuration of a planarization apparatus including a cover plate.

A composition (UV-curable composition) supplied onto a substrate by a supplier 4 starts to volatilize immediately after it is supplied. The higher the saturated vapor pressure, the higher the evaporation rate of the UV-curable composition. The evaporation rate decreases when the vapor pressure in the space approaches the saturated vapor pressure due to the volatilization of the UV-curable composition supplied onto the substrate. Hence, in this embodiment, a cover plate 1001 that prevents volatilization of the composition is arranged. As shown in FIG. 10, the cover plate 1001 is arranged so as to cover the surface of a substrate 2 from above while providing a gap G between the cover plate 1001 and the substrate 2 in the moving range of the substrate 2 along the conveyance path of substrate chucks S1/S2/S3. The gap G between the substrate 2 on each of the substrate chucks S1/S2/S3 and the cover plate 1001 is set to be, for example, 0.5 mm to 4 mm. With this, the vapor pressure of the composition in the gap becomes readily saturated, and volatilization of the composition can be minimized accordingly. The cover plate 1001 covers the substrate at least from above the movement path of the substrate between the supplier 4 and immediately below planarization head systems P1/P2/P3. FIG. 10 shows an example of the cover plate 1001 in the configuration according to the second embodiment (FIG. 9) in which a plurality curing devices are arranged at positions different from the planarization head systems. In the example shown in FIG. 10, the cover plate 1001 is arranged between the substrate receiving position and the supplier 4, between the supplier 4 and the planarization head systems P1/P2/P3, and between the planarization head systems P1/P2/P3 and light sources E1/E2/E3.

According to this embodiment, volatilization of the composition can be suppressed more, and the performance of the planarization process can be improved accordingly.

<Embodiment of Article Manufacturing Method>

A method of manufacturing an article (a semiconductor IC element, a liquid crystal display element, a color filter, a MEMS, or the like) by using the above-described planarization apparatus will be described next. The manufacturing method includes, by using the above-described planarization apparatus, a step of planarizing a composition by bringing the composition arranged on a substrate (a wafer, a glass substrate, or the like) and a superstrate into contact with each other, a step of curing the composition, and a step of separating the composition and the superstrate from each other. With this, a planarized film is formed on the substrate. Then, processing such as pattern formation using a lithography apparatus is performed on the substrate with the planarized film formed thereon, and the processed substrate is processed in other known processing steps to manufacture an article. Other known steps include patterning exposure and accompanying preprocessing, etching, resist removal, dicing, bonding, packaging, and the like. This manufacturing method can manufacture an article with higher quality than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-182059, filed Nov. 8, 2021, which is hereby incorporated by reference herein in its entirety.

What is claimed is:

1. A planarization apparatus comprising:

a plurality of processors each including a substrate chuck, and configured to perform a planarization process on a substrate chucked by the substrate chuck;

a conveyer configured to convey a substrate chuck of a processor selected from the plurality of processors along a conveyance path including a common conveyance path shared by the plurality of processors; and a supplier arranged on a path of movement of the substrate chuck by the conveyer along the common conveyance path, and configured to supply a composition to be used in the planarization process onto the substrate chucked by the substrate chuck, wherein the plurality of processors are arrayed in a row, and the common conveyance path is provided so as to extend along the row, and wherein the conveyer includes:

a first guide rail extending along the row and forming the common conveyance path, a first clutch configured to move while being connected with the substrate chuck and guided by the first guide rail, a second guide rail forming an individual conveyance path which branches from the common conveyance path to each of the plurality of processors, and a second clutch configured to move while being connected with the substrate chuck and guided by the second guide rail in a state in which the connection with the first clutch is released.

2. The apparatus according to claim 1, wherein the conveyer is configured to convey a first substrate chuck, which is the substrate chuck of a first processor selected from the plurality of processors, to a substrate receiving position in an end portion of the common conveyance path, the first substrate chuck is configured to receive and chuck a first substrate loaded to the substrate receiving position, the conveyer is configured to convey, below the supplier, the first substrate chuck chucking the first substrate, the supplier is configured to supply the composition onto the first substrate chucked by the first substrate chuck, and the conveyer is configured to convey, to the first processor, the first substrate chuck chucking the first substrate supplied with the composition by the supplier.

3. The apparatus according to claim 2, wherein the conveyer is configured to convey a second substrate chuck, which is the substrate chuck of a second processor selected from the plurality of processors, to the substrate receiving position for receiving a second substrate while the first processor performs the planarization process on the first substrate.

4. The apparatus according to claim 1, wherein the planarization process is performed by forming a planarized film of the composition on the substrate by bringing a flat surface of a superstrate into contact with the composition on the substrate.

5. The apparatus according to claim 4, further comprising a plurality of light sources arranged at positions different from the plurality of processors, and configured to generate exposure light for curing the composition, wherein the second guide rail further forms an extended individual conveyance path extending from the individual conveyance path which branches from the common conveyance path to each of the plurality of processors, and wherein the conveyer is further configured to convey the substrate chuck along the extended individual conveyance path between each of the plurality of processors and each of the plurality of light sources.

6. The apparatus according to claim 5, further comprising a superstrate chuck configured to chuck the superstrate, wherein the conveyer is configured to, in a state in which the superstrate is in contact with the composition on the substrate by the planarization process performed in a processor selected from the plurality of processors, and the superstrate chuck dechucks the superstrate, convey the substrate chuck of the selected processor, which chucks the substrate, to a light source of the plurality of light sources corresponding to the selected processor.

7. The apparatus according to claim 1, further comprising a cover plate configured to cover a surface of the substrate from above while providing a gap between the cover plate and the substrate in a moving range of the substrate along the conveyance path.

8. An article manufacturing method comprising:

forming a planarized film on a substrate using a planarization apparatus defined in claim 1; and processing the substrate with the planarized film formed thereon, wherein an article is manufactured from the processed substrate.

* * * * *